United States Patent
Kalluri et al.

(10) Patent No.: US 12,050,936 B2
(45) Date of Patent: Jul. 30, 2024

(54) ENHANCED PROCESSING FOR COMMUNICATION WORKFLOWS USING MACHINE-LEARNING TECHNIQUES

(71) Applicant: Oracle International Corporation, Redwood Shores, CA (US)

(72) Inventors: Sudhakar Kalluri, Cupertino, CA (US); Venkata Chandrashekar Duvvuri, Los Gatos, CA (US)

(73) Assignee: Oracle International Corporation, Redwood Shores (CA)

(*) Notice: Subject to any disclaimer, the term of this patent is extended or adjusted under 35 U.S.C. 154(b) by 624 days.

(21) Appl. No.: 16/800,911

(22) Filed: Feb. 25, 2020

(65) Prior Publication Data
US 2021/0264251 A1 Aug. 26, 2021

(51) Int. Cl.
| | |
|---|---|
| G06F 9/00 | (2018.01) |
| G06F 9/48 | (2006.01) |
| G06F 9/50 | (2006.01) |
| G06F 18/214 | (2023.01) |
| G06F 30/27 | (2020.01) |
| G06N 3/08 | (2023.01) |
| G06V 10/764 | (2022.01) |
| G06V 10/77 | (2022.01) |
| G06V 10/778 | (2022.01) |

(52) U.S. Cl.
CPC .......... *G06F 9/5038* (2013.01); *G06F 9/4881* (2013.01); *G06F 18/2148* (2023.01); *G06F 30/27* (2020.01); *G06N 3/08* (2013.01); *G06V 10/764* (2022.01); *G06V 10/7715* (2022.01); *G06V 10/7784* (2022.01)

(58) Field of Classification Search
CPC ......... G06N 3/08; G06F 30/27; G06F 9/4881; G06K 9/6257
USPC ......................................................... 706/25
See application file for complete search history.

(56) References Cited

U.S. PATENT DOCUMENTS

| | | | |
|---|---|---|---|
| 10,963,808 B1* | 3/2021 | Kumari | G06N 20/00 |
| 11,397,614 B2 | 7/2022 | Kalluri et al. | |
| 11,397,873 B2 | 7/2022 | Kalluri et al. | |
| 2013/0212190 A1 | 8/2013 | Patil | |
| 2018/0285777 A1* | 10/2018 | Li | H04L 67/535 |
| 2019/0026697 A1 | 1/2019 | Burton et al. | |
| 2019/0044942 A1 | 2/2019 | Gordon et al. | |
| 2019/0102681 A1 | 4/2019 | Roberts et al. | |

(Continued)

OTHER PUBLICATIONS

Jannach et al., "Supporting the Design of Machine Learning Workflows with a Recommendation System", The ACM Transactions on Interactive Intelligent Systems, vol. 6, Issue 1, Feb. 2016, pp. 1-35.

(Continued)

*Primary Examiner* — Tiffany P Young
(74) *Attorney, Agent, or Firm* — Mughal Gaudry & Franklin PC

(57) ABSTRACT

The present disclosure generally relates to evaluating communication workflows comprised of tasks using machine-learning techniques. More particularly, the present disclosure relates to systems and methods for generating a prediction of a task outcome of a communication workflow, generating a recommendation of one or more tasks to add to a partial communication workflow to complete the communication workflow, and generating a vector representation of a communication workflow.

20 Claims, 10 Drawing Sheets

(56) References Cited

U.S. PATENT DOCUMENTS

| | | |
|---|---|---|
| 2019/0332892 A1 | 10/2019 | Wickesberg |
| 2020/0184376 A1 | 6/2020 | Parameswaran et al. |
| 2021/0056434 A1* | 2/2021 | Raghunathan ......... G06N 20/20 |
| 2021/0117243 A1 | 4/2021 | Ghafourifar |
| 2021/0132947 A1 | 5/2021 | John et al. |
| 2021/0209501 A1* | 7/2021 | Sarferaz ............... G06K 9/6282 |
| 2021/0241132 A1 | 8/2021 | Ramachandran et al. |
| 2021/0264202 A1* | 8/2021 | Kalluri ................... G06F 18/23 |
| 2021/0287130 A1 | 9/2021 | Kalluri |

OTHER PUBLICATIONS

Singh et al., "A Machine Learning Approach for Modular Workflow Performance Prediction", Proceedings of the 12th workshop on workflows in support of large-scale Science, Nov. 2017, 11 pages.
U.S. Appl. No. 16/800,869 received a Notice of Allowance, mailed on Apr. 4, 2022, 9 pages.
U.S. Appl. No. 16/800,907 received a Notice of Allowance, mailed on Apr. 4, 2022, 9 pages.
International Application No. PCT/US2021/019636, International Search Report and Written Opinion mailed on May 21, 2021, 11 pages.
International Application No. PCT/US2021/019643, International Search Report and Written Opinion mailed on Jul. 7, 2021, 14 pages.
International Application No. PCT/US2021/019636, "International Preliminary Report on Patentability", Sep. 9, 2022, 8 pages.
International Application No. PCT/US2021/019643, "International Preliminary Report on Patentability", Sep. 9, 2022, 11 pages.

* cited by examiner

ENHANCED PROCESSING FOR COMMUNICATION WORKFLOWS USING MACHINE-LEARNING TECHNIQUES

TECHNICAL FIELD

The present disclosure generally relates to using machine-learning techniques to evaluate communication workflows comprised of tasks. More particularly, the present disclosure relates to systems and methods for generating a prediction of a task outcome of a communication workflow using machine learning or artificial intelligence, generating a recommendation of one or more tasks to add to a partial communication workflow to complete the workflow, and generating a vector representation of a communication workflow.

BACKGROUND

Workflows may be configured to trigger the transmission of communications to users at certain times. For example, code can be executed to trigger one or more communications to a user device over a communication channel at a given time. Multiple communications over different communication channels may be coordinated in a workflow to engage individual users. Evaluating the prospects of the tasks resulting in target actions performed by users, however, is a technical challenge at a big-data scale due to the complexities of the workflows. Determining which tasks to include in a workflow is often manually performed without leveraging previous workflows. Additionally, given the complexities of task arrangements in various workflows, evaluating workflows against one another is inefficient and computationally burdensome.

SUMMARY

Certain aspects and features of the present disclosure relate to processing communication workflows using machine learning or artificial intelligence. A communication workflow may include an ordered sequence of one or more tasks. Performing a communication workflow may include executing the one or more tasks in the ordered sequence. For example, executing a task of a communication workflow may include causing a server to transmit a communication (e.g., a digital message) to a target group of user devices over a communication channel. The communication may be configured to enable a user operating a user device of the target group to perform one or more actions (e.g., select a link included in the communication). An indication of the action(s) performed at the user device may be received at a cloud-based application. When the task(s) of a communication workflow have been executed, the cloud-based application may determine a task outcome of the communication workflow. A task outcome may represent an overall performance metric of the communication workflow. For example, an overall performance metric may include a percentage of user devices (of the target group of user devices) that performed a target action (e.g., selected the link included in the communication) aggregated across all tasks of the communication workflow.

To illustrate and only as a non-limiting example, a communication workflow may include a sequence of two tasks: a first task being an email communication task and a (subsequent) second task being a text message task. The email task may include transmitting an email communication to a target group of mobile devices. The text message task may include transmitting, at a later time, a text message (e.g., Short Message Service (SMS)), to a subset of the target group of mobile devices. When the email communication is received at the target group of mobile devices, the email communication may include a selectable link. When the text message is received at the subset of the target group of mobile devices, the text message may also include the selectable link. A cloud-based application may receive an indication of whether or not the link was selected at the target group of mobile devices through the email communication or through the text message. The cloud-based application may determine the task outcome of the communication workflow (e.g., the overall performance metric of both tasks) as the percentage of users who selected the link through either the email communication or the text message. As another example, the cloud-based application may add together a partial transmission count (e.g., a number of communications transmitted) for each of the email communication task and the text message task of the communication workflow. The cloud-based application may also add together a partial link selection count (e.g., a number of links selected) for each of the email communication task and the text message task. The cloud-based application may then determine the task outcome of the communication workflow by determining a ratio of the total link selection count over the total transmission count.

According to some aspects described herein, a task outcome of a communication workflow can be predicted by generating a composite feature vector representing the communication workflow and inputting the composite feature vector into a machine-learning model. The machine-learning model may be trained using previously-executed communication workflows and the corresponding task outcomes of those previously-executed communication workflows. In addition, certain aspects and features may relate to using machine-learning techniques to generate recommendations of tasks to add to a partial communication workflow to complete the partial communication workflow. A set of tasks, to complete a partial communication workflow, can be recommended by inputting the composite feature vector of the partial communication workflow into a machine-learning model to generate an output representing tasks that yielded certain values of task outcomes (e.g., values of task outcomes that above a threshold) of the previously-executed communication workflows. Certain aspects and features may also relate to using a neural network (e.g., a Graph2Vec model) to generate a vector representation of a communication workflow in a computationally efficient manner. The vector representation can be inputted into various machine-learning models to perform various functions. The vector representation, according to some aspects of the present disclosure, may represent the entire communication workflow, including the structure, the tasks, and the content of the tasks.

In some implementations, a cloud-based application may generate composite feature vectors that represent the tasks of individual communication workflows that were previously executed. The composite feature vectors may be generated using multi-dimensional machine-learning feature vectors (e.g., singular value decomposition (SVD)). The composite feature vectors can be inputted into a machine-learning model to generate outputs predictive of a task outcome (e.g., the overall performance metric or overall rate of a target action being performed by users receiving a communication) of a new communication workflow or outputs representing recommendations of tasks to include in a new partial or incomplete communication workflow.

In some examples, a communication workflow may be a marketing campaign orchestration (MCO). The communication workflow may include an ordered sequence of tasks. A task may be configured to transmit a digital communication to a group of target user devices (e.g., an audience). In some examples, a composite feature vector may be used as a standardized representation of a communication workflow, representing the tasks, parameters, target users, and content of the communication workflow. Multi-dimensional machine-learning feature vectors may be generated to create the composite feature vector. Each task of the ordered sequence of tasks in a communication workflow may be represented by a task vector (e.g., a feature vector). The group of target user devices that are targeted to receive communications as a result of executing a task may be represented by a group vector. In some examples, the structure of a communication workflow and the component task vectors may be combined to generate the composite feature vector that represents the communication workflow.

The ordered sequence of tasks included in a communication workflow may represent the structure of the workflow. The structure of each communication workflow can include one or more nodes (e.g., start, split and end nodes) or one or more stages (e.g., tasks, such as transmitting an email to a set of user devices) that are connected together, for example, by one or more branches. A branch may include a flow of a sequence of tasks (e.g., a filter task, transmit task, or a delay task). For example, a node may represent a split task, in which a target group of user devices is split into two or more sub-groups. In some examples, the structure of a communication workflow may include a root node (e.g., a start task indicating the start of a communication workflow), intermediate nodes (e.g., a communication task that, when executed, transmits a communication, such as an email, to a user device), and leaf nodes (e.g., an end node indicating the end of a communication workflow). Each tree branch may include a sequence of one or more tasks. A composite feature vector can be generated to represent the entire structure, the tasks, and the content of communications of each task in a communication workflow.

In some implementations, a cloud-based application may input the composite feature vector of a communication workflow into a machine-learning model to generate an output predictive of the task outcome of the communication workflow. The task outcome may represent the performance of the communication workflow, including, for example, a click rate or conversion rate of the target group of users to be targeted by the communication workflow. In some implementations, given a new partial communication workflow (e.g., one that is being developed and that is not yet complete), the composite feature vectors of partial portions of previously-executed workflows and the composite feature vector of the new partial communication workflow can be evaluated using machine-learning models. The machine-learning models, according to these implementations, may generate outputs representing a recommendation of one or more tasks to add to the new partial communication workflow to complete the new partial communication workflow.

In some implementations, a communication workflow can be analyzed as a graph using machine-learning techniques (e.g., Graph2Vec) to learn the rooted subgraphs of each node in the graph. The machine-learning techniques may generate vector representations of entire workflows without separating the structure of the communication workflow from the composite feature vector of the communication workflow. The vector representation, according to these implementations, may generate an n-dimensional vector that represents an entire communication workflow, including the structure, tasks, and task content. As a non-limiting example, neural networks of Graph2Vec models may be executed to learn the rooted subgraph embeddings of a communication workflow in an unsupervised manner. The resulting vector representations may be inputted into machine-learning models to generate predictions of a task outcome of a new communication workflow or to generate recommendations of tasks to add to partial communication workflows to complete the partial communication workflows, as described above.

In some implementations, a system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a computer-implemented method including: accessing a workflow including one or more tasks coordinated in a sequential order, the workflow being configured to facilitate interacting with a set of user devices, each task of the one or more tasks including executable code that, upon execution, performs a function (e.g., split, filter, transmit) associated with the set of user devices, and the workflow being associated with one or more parameters that characterize each task of the one or more tasks of the workflow (e.g., vocabularies for topic-modeling, content images, etc.); generating a composite feature vector representing the workflow, the composite feature vector being generated using a feature vector of each task of the one or more tasks of the workflow, and the feature vector of each task of the one or more tasks being generated by executing one or more machine-learning techniques using the one or more parameters that characterize the task; inputting the composite feature vector of the workflow into a trained machine-learning model, the trained machine-learning model having been trained to predict a performance value of the workflow, and the trained machine-learning model having been trained using a training data set representing one or more previously-executed workflows and a corresponding previous performance value of each of the one or more previously-executed workflows; and generating an output using the trained machine-learning model, the output being predictive of the performance value of the workflow. Other embodiments of this aspect include corresponding computer systems, apparatus, and executable code stored on non-transitory computer-readable storage medium, each configured to perform the actions of the methods.

Implementations may include one or more of the following features. The computer-implemented method further including: determining a structure of the workflow, the structure being represented by a plurality of nodes of a tree structure, where two nodes of the plurality of nodes of the tree structure are connected by one or more stages, where each task of the one or more tasks of the workflow corresponds to a node of the plurality of nodes or a stage of the one or more stages; and evaluating the training data set to determine whether the structure of the workflow matches a structure of at least one previously-executed workflow of the one or more previously-executed workflows. The computer-implemented method further including: determining that the structure of the workflow matches (e.g., the same as) the structure of a group of previously-executed workflows of the one or more previously-executed workflows of the training data set. The computer-implemented method may also include comparing the composite feature vector of the workflow with a composite feature vector of each previously-executed workflow of the group of previously-executed workflows in a domain space. The computer-implemented method may also include selecting a sub-group of the group of previously-executed workflows based on a threshold and a result of the comparison. The computer-implemented method may also include identifying a previous performance value for each previously-executed workflow of the sub-group of previously-executed workflows. The computer-implemented method may also include generating the output predictive of the performance value of the workflow by determining a combination of the previous performance values associated with the sub-group of previously-executed workflows. The computer-implemented method further including: determining that the structure of the workflow matches the structure of a group of previously-executed workflows of the one or more previously-executed workflows of the training data set, where during generation of the training data set: one or more subsets of previously-executed workflows are determined, each subset of the one or more subsets corresponding to two or more previously-executed workflows that share a common structure. The computer-implemented method may also include a clustering operation (e.g., k-means clustering) is performed on each subset of the one or more subsets of previously-executed workflows, where each subset of previously-executed workflows is associated with one or more clusters of previously-executed workflows, where the one or more clusters are formed by performing the clustering operation on the composite feature vectors of the subset of previously-executed workflows in a domain space, and where each previously-executed workflow included in a cluster is associated with a composite feature vector that corresponds to the composite feature vectors of other previously-executed workflows in that cluster; generating the output predictive of the performance value of the workflow by identifying a particular subset of the one or more subsets of the training data set for which the corresponding structure corresponds to the structure of the workflow. The computer-implemented method may also include assigning the workflow to a particular cluster of the one or more clusters that correspond to the particular subset, based on a comparison of the composite feature vector of the workflow and the feature vector for each cluster of the one or more clusters. The computer-implemented method may also include determining a combination of the previous performance values associated with the previously-executed workflows associated with the particular cluster to which the workflow is assigned. The computer-implemented method further including: determining that the structure of the workflow matches the structure of a group of previously-executed workflows of the one or more previously-executed workflows of the training data set, where during generation of the training data set: one or more subsets of previously-executed workflows are identified, each subset of the one or more subsets corresponding to two or more previously-executed workflows that share a common structure. The computer-implemented method may also include a supervised machine-learning model is trained for each subset of the one or more subsets of previously-executed workflows; generating the output predictive of the performance value of the workflow by: identifying a particular subset of the one or more subsets of the training data set for which the corresponding structure matches the structure of the workflow, inputting the composite feature vector of the workflow into the supervised machine-learning model that corresponds to the particular subset, and generating the output predictive of the performance value of the workflow. The computer-implemented method further including: determining that the structure of the workflow does not match the structure of any previously-executed workflow of the one or more previously-executed workflows of the training data set; and generating the output predictive of the performance value of the workflow by: segmenting each previously-executed workflow of the one or more previously-executed workflows of the training data set into a plurality of previously-executed sub-workflows. The computer-implemented method may also include comparing the structure of the workflow to each sub-workflow of the plurality of sub-workflows of each previously-executed workflow of the one or more previously-executed workflows of the training data set. The computer-implemented method may also include identifying a group of previously-executed sub-workflows of the plurality of previously-executed sub-workflows, the group of previously-executed sub-workflows matching the structure of the workflow. The computer-implemented method may also include comparing the composite feature vector of the workflow with a composite feature vector of each previously-executed sub-workflow of the group of previously-executed sub-workflows in a domain space. The computer-implemented method may also include selecting a sub-group of the group of previously-executed sub-workflows based on a threshold and a result of the comparison. The computer-implemented method may also include determining a predicted performance value of the workflow based on the previous performance values associated with the selected sub-group of previously-executed sub-workflows. The computer-implemented method where the workflow is defined by a list including metadata describing: the structure of the workflow. The computer-implemented method may also include each task included in the workflow. The computer-implemented method may also include each feature vector representing a task of the one or more tasks of the workflow. The computer-implemented method may also include where the list is parsed to perform one or more functions. Implementations of the described techniques may include hardware, a method or process, or computer software on a computer-accessible medium.

In some implementations, a system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a computer-implemented method including: providing an interface that enables a user to define a workflow, the workflow being configurable to include a set of tasks that facilitate interactions with a set of user devices, and each task of the set of tasks including executable code that, upon execution, performs a function (e.g., split, filter, transmit) associated with the set of user devices; receiving, at the interface, input corresponding to a selection of one or more tasks from the set of tasks, the one or more tasks defining a partial workflow, the partial workflow being associated with one or more parameters that characterize each task of the one or more tasks of the partial workflow (e.g., vocabularies for topic-modeling, content images, etc.); identifying a structure of the partial workflow, the structure of the partial workflow being represented by one or more nodes and/or one or more stages, where each task of the one or more tasks of the partial workflow corresponds to a node of the one or more nodes or a stage of the one or more stages; generating a composite feature vector representing the partial workflow, the composite feature vector being generated using a feature vector of each task of the one or more tasks of the workflow, and the feature vector of each task of the one or more tasks being generated by executing one or more machine-learning techniques using the one or more parameters that characterize the task (e.g., constructing a machine-learning feature vector based on the parameters of the nodes and/or tasks of the new partial workflow); accessing a set of previously-executed partial workflows, each previously-executed partial workflow of the set of previously-executed partial workflows being represented by a structure, a composite feature vector, and a performance value. The computer-implemented method also includes selecting a subset of the set of previously-executed partial workflows, the subset of previously-executed partial workflows sharing a same structure with the partial workflow. The computer-implemented method also includes determining, from the subset of previously-executed partial workflows, one or more previously-executed partial workflows that are similar to the partial workflow, the similarity being based on a comparison between the composite feature vector of each previously-executed partial workflow of the subset and the composite feature vector of the partial workflow; generating a recommendation for completing the partial workflow, the recommendation including one or more recommended tasks that complete the partial workflow, the one or more recommended tasks being selected from one or more remaining tasks of a previously-executed partial workflow of the one or more previously-executed partial workflows that share the same structure with the partial workflow and that are determined to be similar to the partial workflow, and the selection being based on the previous performance values of the one or more previously-executed partial workflows that share the same structure with the partial workflow and that are determined to be similar to the partial workflow; and displaying the recommendation on the interface. Other embodiments of this aspect include corresponding computer systems, apparatus, and executable code or instructions (e.g., a computer-program product) stored on non-transitory computer-readable storage medium, each configured to perform the actions of the methods.

Implementations may include one or more of the following features. The computer-implemented method where comparing the composite feature vector of each previously-executed partial workflow, from the subset of previous-executed partial workflows sharing a same structure with the partial workflow, with the composite feature vector of the partial workflow includes: calculating, for each previously-executed partial workflow, a distance between the composite feature vector of the previously-executed partial workflow and the composite feature vector of the partial workflow in a domain space; and comparing the distance with a threshold value, where when the distance is equal to or less than the threshold value, then the previously-executed partial workflow is determined to be similar to the partial workflow, and where when the distance is larger than the threshold value, then the previously-executed partial workflow is determined to not be similar to the partial workflow. The computer-implemented method further including: ordering the one or more previously-executed partial workflows that share the same structure as the partial workflow and that are determined to be similar to the partial workflow, by arranging the one or more previously-executed partial workflows from the highest performance value to lowest performance value. The computer-implemented method further including: receiving additional input at the interface, the additional input corresponding to a selection of the one or more recommended tasks to complete the partial workflow. The computer-implemented method may also include in response to receiving the additional input, adding the one or more recommended tasks to the one or more tasks in a sequential order to represent a complete workflow. The computer-implemented method further including: receiving additional input at the interface, the additional input corresponding to a selection of at least one recommended task of the one or more recommended tasks and at least one task that is not included in the one or more recommended tasks, the selection of the at least one recommended task and the at least one task that is not included in the one or more recommended tasks completing the partial workflow. The computer-implemented method may also include in response to receiving the additional input, adding the at least one recommended task and the at least one task that is not included in the one or more recommended tasks to the one or more tasks in a sequential order to represent a complete workflow. The computer-implemented method where a partial or complete workflow is defined by a list including metadata describing: the structure of the workflow, each task included in the workflow, and each feature vector representing a task of the set of tasks included in the workflow. The computer-implemented method further including: parsing through the list to perform one or more functions. Implementations of the described techniques may include hardware, a method or process, or computer software on a computer-accessible medium.

In some implementations, a system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a computer-implemented method including: accessing a workflow including one or more tasks coordinated in a sequential order, the workflow being configured to facilitate interacting with a set of user devices, each task of the one or more tasks including executable code that, upon execution, performs a function (e.g., split, filter, transmit) associated with the set of user devices, and the workflow being associated with one or more parameters that characterize each task of the one or more tasks of the workflow (e.g., vocabularies for topic-modeling, content images, etc.); defining a tree structure of the workflow, the tree structure including a plurality of nodes and one or more stages, where two nodes of the plurality of nodes of the tree structure are connected by at least one stage of the one or more stages, and where each task of the one or more tasks of the workflow corresponds to a node of the plurality of nodes or a stage of the one or more stages; inputting the tree structure into a machine-learning model (e.g., a graph-to-vector model), the inputting of the tree structure into the machine-learning model resulting in sampling one or more partial tree structures of the tree structure of the workflow; and generating a vector representation of the tree structure of the workflow. Other embodiments of this aspect include corresponding computer systems, apparatus, and executable code stored on non-transitory computer-readable storage medium, each configured to perform the actions of the methods.

Implementations may include one or more of the following features. The computer-implemented method further including: accessing a set of previously-executed workflows; defining a tree structure for each previously-executed workflow of the set of previously-executed workflows; inputting the tree structure of each previously-executed workflow of the set of previously-executed workflows into the machine-learning model; generating a vector representation representing the tree structure of each previously-executed workflow of the set of previously-executed workflows; and storing the vector representation of each previously-executed workflow in a training data set. The computer-implemented method where the vector representation of the tree structure is generated without evaluating a vector representation of an individual node of the plurality of nodes or of an individual stage of the one or more stages of the tree structure. The computer-implemented method where each node of the plurality of nodes and each stage of the one or more stages of the tree structure is associated with metadata used to characterize the task or a portion of the workflow. The computer-implemented method where the metadata associated with each node or stage represents a function performed by the task associated with the node or stage, respectively. The computer-implemented method where the machine-learning technique is a neural network configured to learn embeddings of the tree structure of the workflow. The computer-implemented method where the evaluation of the one or more nodes of the tree structure further includes: extracting one or more rooted partial tree structures for each node of the plurality of nodes or each stage of the one or more stages of the tree structure of the workflow, each rooted partial tree structure of the one or more rooted partial tree structure including a set of nodes one or more hops away from the node or stage. The computer-implemented method may also include training the machine-learning model using the one or more rooted partial tree structures. Implementations of the described techniques may include hardware, a method or process, or computer software on a computer-accessible medium.

BRIEF DESCRIPTION OF THE DRAWINGS

The specification makes reference to the following appended figures, in which use of like reference numerals in different figures is intended to illustrate like or analogous components.

DETAILED DESCRIPTION

Figure 1:
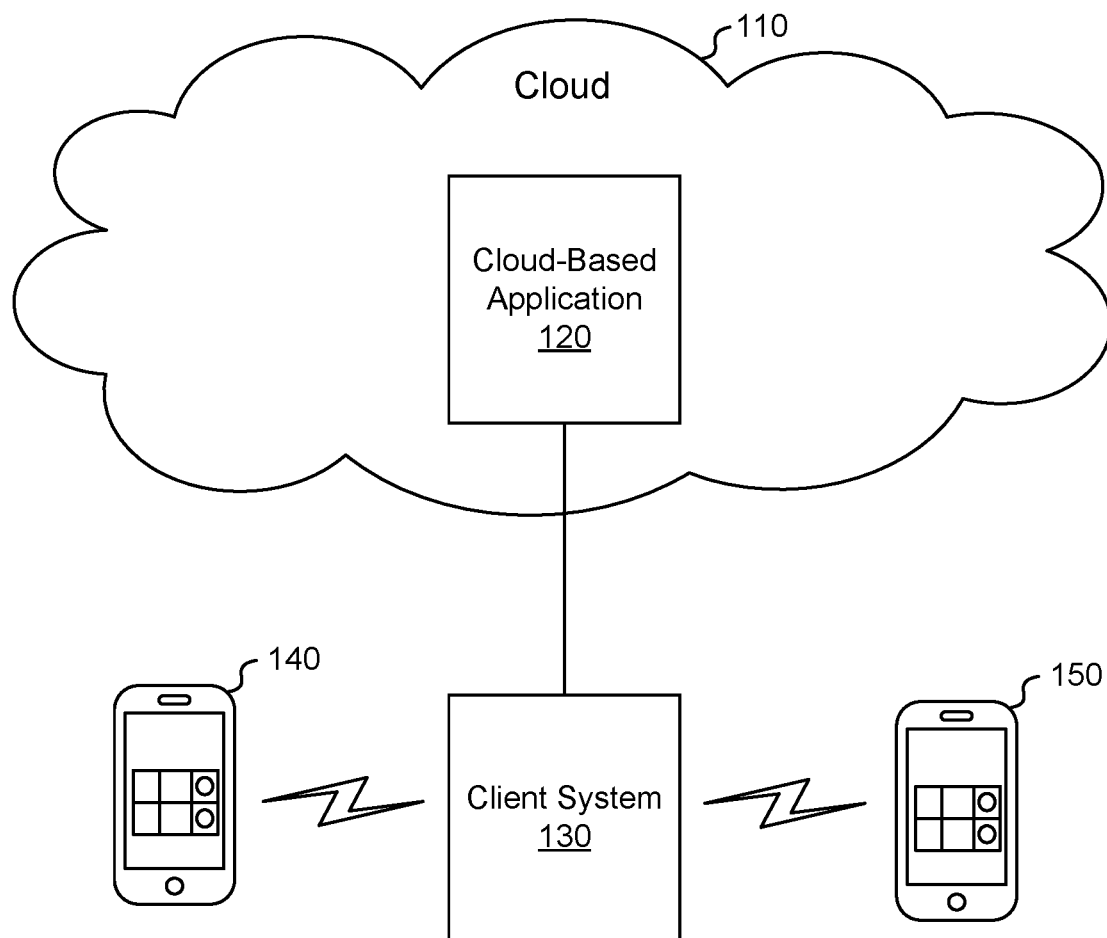
FIG. 1 is a block diagram illustrating an example of a network environment, according to some aspects of the present disclosure.

Cloud-based applications may include data management platforms hosted on cloud networks. Data management platforms may be configured to enable users to perform certain functionality on data records. For example, a data record may be a user profile that includes one or more data fields. A data field of a data record may include values that characterize a user associated with the user profile. The data field may be generated based on a previous interaction, such as an interaction between a browser operated by a user and a web server.

Communication workflows may be executed by a cloud-based application (or in some cases, by one or more servers external to the cloud network) to process certain data records. As a non-limiting example, a communication workflow may be configured to perform a coordinated sequence of one or more tasks (e.g., transmit digital messages that engage users) on a target group of user profiles. A task, upon being executed by a server, may cause the server to transmit a communication over a communication channel to a user device associated with a user profile. The content of the communication and the communication channel selected to transmit the communication may be determined based on the configuration of the task and the communication workflow. Including a target group of user devices in a communication workflow may cause the task included in the workflow to transmit a communication over a communication channel to each user device of the target group. Configurations of the task may define the content of the communication and the type of communication channel selected for facilitating the transmission of the communication. Non-limiting examples of communication channels include SMS messaging, email, phone call, pop-up message while browsing a webpage, and other suitable communication channels.

As the complexity of communication workflows has increased, the configuration and execution of the communication workflows is a technical challenge. Further, comparing two or more complex communication workflows together is also a significant technical challenge. As a practical application, certain aspects and features of the present disclosure generate vector representations of communication workflows to enhance the computational efficiency of comparing various new and previously-executed communication workflows to predict the performance of the new communication workflows and to recommend tasks for completing partial communication workflows. Thus, certain aspects and features of the present disclosure improve the technology of cloud-based data management platforms by enabling the platforms to compare and evaluate various communication workflows in a computationally efficient manner using vectors (e.g., composite feature vectors or vectors generated using graph-to-vector models) to represent the structure and content of communication workflows.

Certain implementations of the present disclosure include a cloud-based application configured to generate vector representations of communication workflows. The vector representations may be generated by evaluating the tasks and the content of the tasks of a communication workflow using machine-learning techniques, such as Latent Dirichlet Allocation (LDA) for topic modeling and Word2Vec models. A feature vector may be generated for each task included in a communication workflow. The feature vectors of the various tasks of the communication workflow may be concatenated to generate a composite feature vector. The composite feature vector can then be inputted into a machine-learning model to generate a prediction of a task outcome of the communication workflow. The composite feature vector may also be inputted into a machine-learning model to generate a recommendation of one or more tasks to include in the communication workflow to complete the workflow.

FIG. 1 is a block diagram illustrating an example of a network environment 100 for processing data records using a data management platform, such as cloud-based application 120. Cloud network 110 may be any cloud-based network that includes one or more cloud-based servers and one or more cloud-based databases. The one or more cloud-based servers of cloud network 110 may include at least one application server that hosts cloud-based application 120, along with at least one database server. For example, cloud-based application 120 may be a data management platform configured to perform functionality associated with one or more data sets of data records. In some implementations, a data record may represent a user profile that includes one or more data fields. Each data field of the one or more data fields may include a value that was generated in response to a user device interacting with a native application or web server during a previous interaction. For example, when a user device accesses a web server to load a webpage on the user device, the web server may extract one or more user features (e.g., location of the originating request to load the webpage) associated with the request from the user device to load the webpage. Various user features may be collected over time in a user profile.

The client system 130 may include a network of one or more servers and databases associated with a client (e.g., an entity, such as a company). In some implementations, the network within the client system 130 may include a web server that hosts one or more webpages or an application server that hosts a native application operated by or associated with the client. User device 140 may interact with the client system 130 by transmitting a communication to the web server of client system 130. For example, the communication may be a request to load a webpage onto a browser running on the user device 140. Similarly, user device 150 may transmit a communication to the client system 130 requesting to load the webpage on the browser of user device 150. It will be appreciated that any number of user devices and of any type of computing device (e.g., desktop computer, tablet computer, electronic kiosk, and so on) may communicate with client system 130.

In some implementations, client system 130 may define one or more workflows for communicating with user devices. A communication workflow may be an orchestrated sequence of one or more tasks, such as an MCO. A task may include executable code that, upon execution by a server, causes client system 130 to transmit a communication to a user device over a communication channel. The content of the communication and the specific communication channel selected for transmitting the communication may be defined by the executable code of the task. For example, a task may be a digital message designed to engage certain target users. The workflow orchestrates a sequence of one or more tasks for an individual user profile over the course of a defined time interval. Workflows may serve as effective at engaging users in relation to certain goods or services. As an illustrative example, client system 130 may store at least two workflows. A first workflow may include two tasks for user device 140, a second workflow may include three tasks for user device 150. The first workflow may include a first task of transmitting a communication to user device 140 using a text messaging communication channel at a first time and a second task of transmitting a communication to user device 140 using an email communication channel at a later second time. The second workflow may include a first task of transmitting a communication to user device 150 using an email communication channel at a first time, a second task of transmitting a communication to user device 150 using a social media communication channel at a later second time (e.g., by transmitting a message to a user's account using a social media platform), and a third task of transmitting a communication to user device 150 using another email communication channel at a later third time. The communication received at a user device may enable the user operating the user device to perform one or more actions. For example, the communication may include a selectable link. The user may select the link or may not select the link. When the user performs an action, client system 130 may detect the action because a signal may have been transmitted back (or the lack of receiving a signal within a defined time period) to client system 130. In some implementations, client system 130 may transmit a signal to cloud-based application 120 hosted on cloud network 110. The signal may include the response received from user devices in response to receiving communications. Continuing with the example above, client system 130 may transmit a signal to cloud-based application 120 when user device 140 responds to each of the first and second tasks, and similarly, when user device 150 responds to each of the first, second, and third tasks. In other implementations, cloud-based application 120 may execute the tasks of the workflow, instead of client system 130 performing the task execution.

In some implementations, client system 130 may access cloud-based application 120 to create, design, or generate a communication workflow. For example, cloud-based application 120 may generate interface data that causes an interface to be displayed on an end user associated with client system 130. The interface may enable the user to create an ordered sequence of tasks and save the ordered sequence as a communication workflow. Each task may be configured to perform a function, such as splitting a target group of user devices into sub-groups or transmitting a communication to the target group of user devices. The cloud-based application 120 may enable the end user associated with client system 130 to generate a composite feature vector representing the communication workflow. The composite feature vector can then be inputted into a trained machine-learning model to generate an output predictive of the task outcome (e.g., the overall performance or predicted success of all the tasks in the communication workflow) of the communication workflow. The cloud-based application 120 may also input the composite feature vector into a trained machine-learning model to generate a recommendation of one or more tasks to add or include in the communication workflow to complete the workflow (if the communication workflow is a partial workflow). The cloud-based application 120 may also execute one or more neural networks to learn the subgraph embeddings of a communication workflow to transform the communication workflow into a vector representation.

Figure 2:
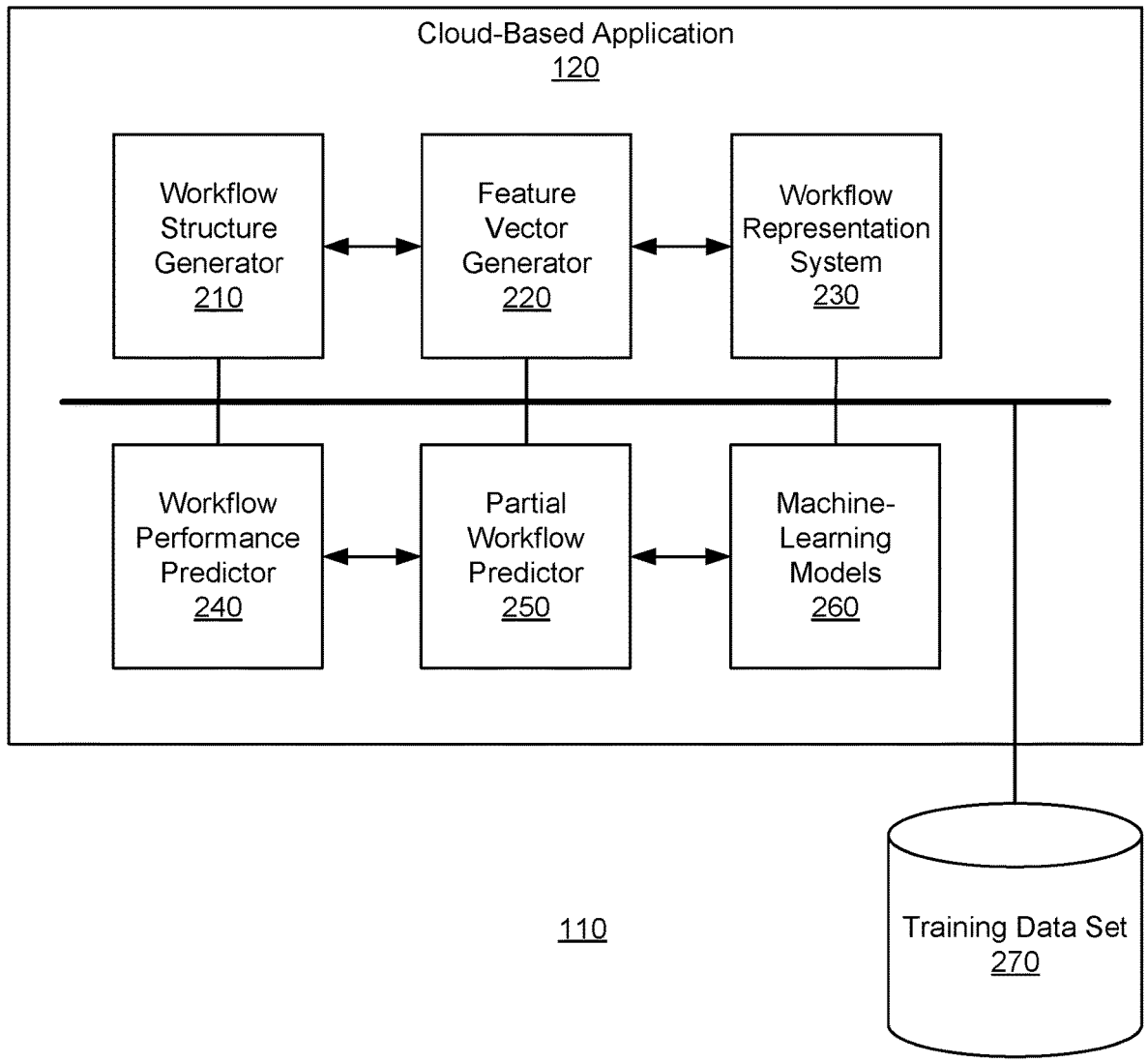
FIG. 2 is a block diagram illustrating another example of a network environment, according to some aspects of the present disclosure.

FIG. 2 is a block diagram illustrating another example of cloud network 110, according to some aspects of the present disclosure. Cloud-based application 120 may include a network of cloud-based servers and databases. In some implementations, the network of cloud-based application 120 may include workflow structure generator 210, feature vector generator 220, workflow representation system 230, workflow performance predictor 240, partial workflow predictor 250, and machine-learning models 260. Machine-learning models 260 may be trained using training data sets 270.

Workflow structure generator 210 may be any server, processor and/or database configured to store and potentially execute code that generates the structure of a communication workflow. Workflow structure generator 210 may receive input from a user accessing cloud-based application 120. The input may represent a selection by the user of one or more tasks to include in a new communication workflow. The one or more tasks may be arranged in an ordered sequence as determined by the user. The ordered sequence of tasks may represent the communication workflow. Workflow structure generator 210 may evaluate the ordered sequence of tasks as the input is received to generate a structure of the communication workflow. The structure may be a tree structure including a plurality of nodes. Each node may represent a task. As an illustrative example, workflow structure generator 210 may generate a structure by searching through a communication workflow for a start task (e.g., the task that initiates the communication workflow). Workflow structure generator 210 may create a hierarchical data structure and use the start task as the root node. Workflow structure generator 210 may continue searching through the communication workflow for the next task, which may be an email task (e.g., a task that transmits an email to a user device). Workflow structure generator 210 may add a stage (e.g., a child node) representing the email task to the root node of the hierarchical data structure. The next task may be a split task, in which the target group of user devices is split into two or more sub-groups. Workflow structure generator 210 may add another node to the hierarchical data structure to represent the split task. Workflow structure generator 210 may continue on adding stages (e.g., nodes) to the hierarchical data structure until the communication workflow reaches an end task (e.g., the task that completes the communication workflow). The resulting hierarchical data structure may represent the structure of the communication workflow. The generated structure may be stored at the workflow structure generator 210.

Feature vector generator 220 may be any server, processor and/or database configured to generate a task vector for each task of the communication workflow. For example, U.S. Ser. No. 16/286,297, filed on Feb. 26, 2019, which is incorporated herein by reference in its entirety for all purposes, describes a process for generating a vector representing a task of a communication workflow. Feature vector generator 220 may then, for example, concatenate the task vectors of the communication workflow. The resulting concatenation of the task vectors may represent the composite feature vector of the communication workflow.

In some implementations, feature vector generator 220 may generate representations of the content and metadata of a task included in a communication workflow. As an illustrative example, for an email task, feature vector generator 220 may generate representations of various parameters of an email communication. Parameters may include numerical and categorical variables of the metadata associated with the email (e.g., product-category, type-of-task, and so on). In this example, the representations of the email metadata may be left as-is, scaled, reduced in dimension, or processed in another manner. Parameters may also include the email subject-line and email body-text. In this case, natural language processing (NLP), term-frequency-matrix, term frequency-inverse document frequency (TF-IDF), topic modeling, and so on, may be executed to transform the text into a vector representation of the text. Parameters may also include email content (e.g., image data). In this case, feature vector generator 220 may transform raw image vectors into task vectors using, for example, dimension-reduction techniques (e.g., non-negative matrix factorization, (NMF), singular value decomposition (SVD), principal component analysis (PCA), and other suitable techniques) or as intermediate outputs of a neural network.

Feature vector generator 220 may also generate one or more vectors representing the one or more target groups of user devices that will receive the one or more communications of the communication workflow. As a non-limiting example, assuming that each user device included in a target group of user devices is represented by a feature vector (e.g., a vector representation of characteristics of the user device), the target group may be summarized by defining the target-group-vector as the average (e.g., centroid) of the feature vectors of the target group's constituent members. The present disclosure is not limited to this technique, however. To illustrate, a communication workflow may include an email communication task and a text message task. The email communication task may be configured to transmit an email to each of a first target group of user devices. The text message task may be configured to transmit a text message to each of a second target group of user devices. In this case, feature vector generator 220 may generate a vector for each of the first and second target groups of user devices.

Workflow representation system 230 may be any server, processor and/or database configured to generate a vector representation of a communication workflow by executing a neural network to learn the graph embeddings of the communication workflow. For example, workflow representation system 230 may input the structure of the communication workflow (e.g., determined by workflow structure generator 210) into a Graph2Vec model to generate n-dimensional vector representation of the communication workflow.

Workflow performance predictor 240 may be any server, processor and/or database configured to receive as input a vector representation of a communication workflow and generate as output a prediction of the task outcome of the communication workflow. In some implementations, the vector representation is the composite feature vector generated by feature vector generator 220. In other implementations, the vector representation is the n-dimensional vector representation of the communication workflow generated by workflow representation system 230. Workflow performance predictor 240 may input the vector representation of the communication workflow into a machine-learning model (e.g., a supervised learning model trained with labeled data, such as known overall performance values of previously-executed workflows). The machine-learning model may be a supervised, semi-supervised, or unsupervised (e.g., k-means clustering) models. The output of the machine-learning model may represent a prediction of a performance of the communication workflow. In some examples, the overall performance of a communication workflow may be represented by a task outcome, which represents the rate of target user-performed actions in response to receiving a communication (e.g., a conversion rate, a click rate of selecting a link contained in a digital message, an open rate of opening a webpage from a link included in the communication, etc.).

It will be appreciated that the action may not necessarily be an action associated with a link included in the communication. The user device may receive a communication with a link, but the user may access a webpage independently to purchase a good or service. Even though the target action may be the selection of the link, the purchasing of the good or service may nonetheless be considered the target action, in cases for example, where the link may have navigated the user to a webpage that enabled the user to purchase the good or service.

Workflow performance predictor 240 may generate an output predictive of a task outcome, which may be a value that represents a predicted rate of target actions performed by users in response receiving the communications across all tasks in the communication workflow. The task outcome may be predicted by evaluating the known task outcomes of previously-executed communication workflows (e.g., computing an average of the known task outcomes of previously-executed communication workflows with the same structure as the new communication workflow and which are determined to be similar in a vector space). Previously-executed communication workflows may be communication workflows for which the tasks have previously been executed. The previously-executed communication workflows may have previously engaged or caused communications to be transmitted to a target group of user devices. The previously-executed communication workflows may be stored in training data set 270. The cloud-based application 120 may have stored the task outcome associated with each previously-executed communication workflow.

In some implementations, workflow performance predictor 240 may identify a set of previously-executed communication workflows that have the same structure as that of the communication workflow. Within the set of previously-executed communication workflows, the workflow performance predictor 240 may identify one or more previously-executed communication workflows that are similar to the communication workflow. Similarity may be measured in the multi-dimensional space of the composite feature vectors of the previously-executed communication workflows. For example, the previously-executed communication workflows of a given structure for which the corresponding composite feature vector is within a threshold distance from the composite feature vector of the communication workflow may be determined as similar to the communication workflow. In some examples, the task outcome of the communication workflow may be predicted based on a combination (e.g., an average, a weighted average, and so on) of the known task outcomes of the previously-executed communication workflows that are determined to be similar to the communication workflow. In some examples, confidence intervals around the predicted task outcome of the communication workflow can be constructed based on a computed variance of the known task outcomes of the previously-executed communication workflows that are determined to be similar to the communication workflow and that are determined to have the same structure as the new communication workflow.

In some implementations, the previously-executed communication workflows may be segmented by structure. For a given structure, the composite feature vectors of the grouped previously-executed communication workflows may be evaluated using machine-learning techniques, such as k-means clustering, to form one or more clusters of previously-executed communication workflows. The clustering may be performed based on the composite feature vectors of the previously-executed communication workflows. Workflow performance predictor 240 may then assign the communication workflow to a cluster based on a comparison of the composite feature vector of the communication workflow and the composite feature vectors associated with each cluster. After the communication workflow is assigned to a cluster, the task outcome of the communication workflow may be predicted based on a combination (e.g., an average, a weighted average, and so on) of the known task outcomes of the previously-executed communication workflows within the cluster. In some examples, confidence intervals around the predicted task outcome of the communication workflow can be constructed based on a computed variance of the known task outcomes of the previously-executed communication workflows within the cluster.

In some implementations, the previously-executed communication workflows may be segmented by structure. For each workflow structure, the workflow performance predictor 240 may train a machine-learning model (e.g., supervised learning classification or regression) using the composite feature vectors of the previously-executed communication workflows having that structure. The composite feature vector of the communication workflow may be inputted into the machine-learning model associated with the structure of the communication workflow to generate the prediction of the task outcome. In some examples, confidence intervals around the predicted task outcome of the communication workflow can be determined based on the particular model type (e.g., linear regression, random-forest regression, and so on).

In some examples, none of the previously-executed communication workflows may share the same structure as the communication workflow. The workflow performance predictor 240 may identify a set of partial portions of previously-executed communication workflows that have the same structure as the communication workflow. The workflow performance predictor 240 may then evaluate the composite feature vectors of the set of partial portions of previously-executed communication workflows to determine which partial portions are similar to the communication workflow, using the techniques described above (e.g., identifying composite feature vectors within a threshold distance from the composite feature vector of the communication workflow). Similar to the above techniques, the known task outcomes of the set of partial portions of previously-executed workflows may be combined (e.g., an average may be determined) to determine the prediction of the task outcome for the communication workflow. In some implementations, the communication workflow may be segmented into partial workflows, such that each partial workflow corresponds to a structure of a previously-executed communication workflow. Using the techniques described above, the task outcome for each partial workflow can be determined based on the known task outcomes of the previously-executed communication workflows that share the same structure as the partial workflow. The predicted task outcome of each partial workflow may then be combined (e.g., an average or a summation) to determine the predicted task outcome of the complete communication workflow.

Partial workflow predictor 250 may be any server, processor and/or database configured to generate recommendations of one or more tasks to complete a communication workflow. Cloud-based application 120 may generate an interface that enables a user to create a communication workflow. If the user has created a partial communication workflow, (e.g., the user has not yet set an end node), then the partial workflow predictor 250 may be configured to generate recommendations to the user of which tasks to add to complete the partial communication workflow. Given a new partial communication workflow, the partial workflow predictor 250 may generate a composite feature vector of the new partial communication workflow based on the techniques described above. The partial workflow predictor 250 may then identify a set of partial portions of previously-executed communication workflows that have the same structure as the new partial communication workflow. The partial workflow predictor 250 may determine partial portions of previously-executed communication workflows that are similar to the new partial communication workflow based on a comparison of composite feature vectors in a domain space, as described above. The partial workflow predictor 250 may rank the set of partial portions of previously-executed communication workflows that are similar to the new partial communication workflow in decreasing order based on the known task outcomes of the previously-executed communication workflows. The partial workflow predictor 250 may then recommend the full previously-executed communication workflows of the one or more partial portions of previously-executed communication workflows that are ranked the highest. The recommendation may include remaining tasks of the partial portions of the previously-executed communication workflows.

Machine-learning models 260 may be any server, processor and/or database configured to generate, train, or execute a machine-learning or artificial intelligence model. For example, the machine-learning models may be generated using one or more machine-learning algorithms, such as an ensemble of multi-label classifiers (e.g., supervised or unsupervised learning), artificial neural networks (including backpropagation, Boltzmann machines, etc.), Bayesian statistics (e.g., Bayesian networks or knowledge bases), Learn-to-Rank techniques, logistical model trees, decision tree models, support vector machines, information fuzzy networks, Hidden Markov models, hierarchical clustering (unsupervised), self-organizing maps, clustering techniques, and other suitable machine-learning techniques (supervised, semi-supervised, or unsupervised).

Feature vector generator 220 may separate the structure representation of a communication workflow (e.g., a tree-based representation of the communication workflow comprising "nodes" and "branches") from the vector representation of the communication workflow (e.g., a concatenation of task vectors and vectors representing the target group of user devices). Further, machine-learning models 260 may generate a model per structure of a previously-executed communication workflow (e.g., one machine-learning model may be generated and trained on the performance values for each individual structure of communication workflows, one pre-computed cluster-set for each structure, and so on). The separate structure representation may be used to select a subset of the training data set 270 of previously-executed communication workflows with the same structure as a new communication workflow (e.g., one that has yet to be executed or that is currently being executed). It will be appreciated, however, that in some implementations, an alternative approach may be to generate one or more lists (e.g., a single list) of metadata describing the entire communication workflow. Cloud-based application 120 may execute code that parses through the list to determine a complete description of the communication workflow, including the structure of the communication workflow, the tasks included in the communication workflow, the task features of each task included in the communication workflow, the composite feature vector of the communication workflow, and other suitable items of information. In some implementations, the list may be a data structure that represents a communication workflow. For example, the list of previously-executed communication workflows may be automatically parsed to identify previously-executed communication workflows having the same structure as a given communication workflow. The list may also be automatically parsed to detect previously-executed communication workflows that are similar to a given communication workflow (e.g., having (i) the same structure, and (ii) being similar in the multi-dimensional domain space of the task vectors of the constituent tasks, and so on). Cloud-based application 120 may evaluate the list as a composite per-communication workflow vector that can serve as the input of tree-based machine-learning models (e.g., training and applying a random-forest model).

To illustrate and only as a non-limiting example, a communication workflow may be comprised of four tasks. The structure of the communication workflow may include four "nodes" (e.g., "start", "split", "end branch 1" and "end branch 2"). The list for this communication workflow may be represented by the following data structure: [num_nodes=4, node_type="start", num_tasks=3, task_type="filter", filter_type, filter_input=[<target_group_vector for "target group 0">], task_type="email_communication", communication_input=[<target_group_vector for "target group 1">], communication_task_vector=[<concatenated task content and context task vector of "task 1">], task_type="delay", delay_input=[<target_group_vector for "target group 1">], delay_value=T1, node_type="split", split_type, split_input=[<target_group_vector for "target group 1">], num_split_outputs=2, num_tasks_split_output_1=0, node_type="end", end_input=[<target_group_vector for "target group 2">], num_tasks_split_output_2=1, task_type="sms_communication", communication_input=[<target_group_vector for "target group 3">], communication_task_vector=[<concatenated task content and context task vector of "task 2">], task_type="end", end_input=[<target_group_vector for "target group 3">] ].

Figure 3:
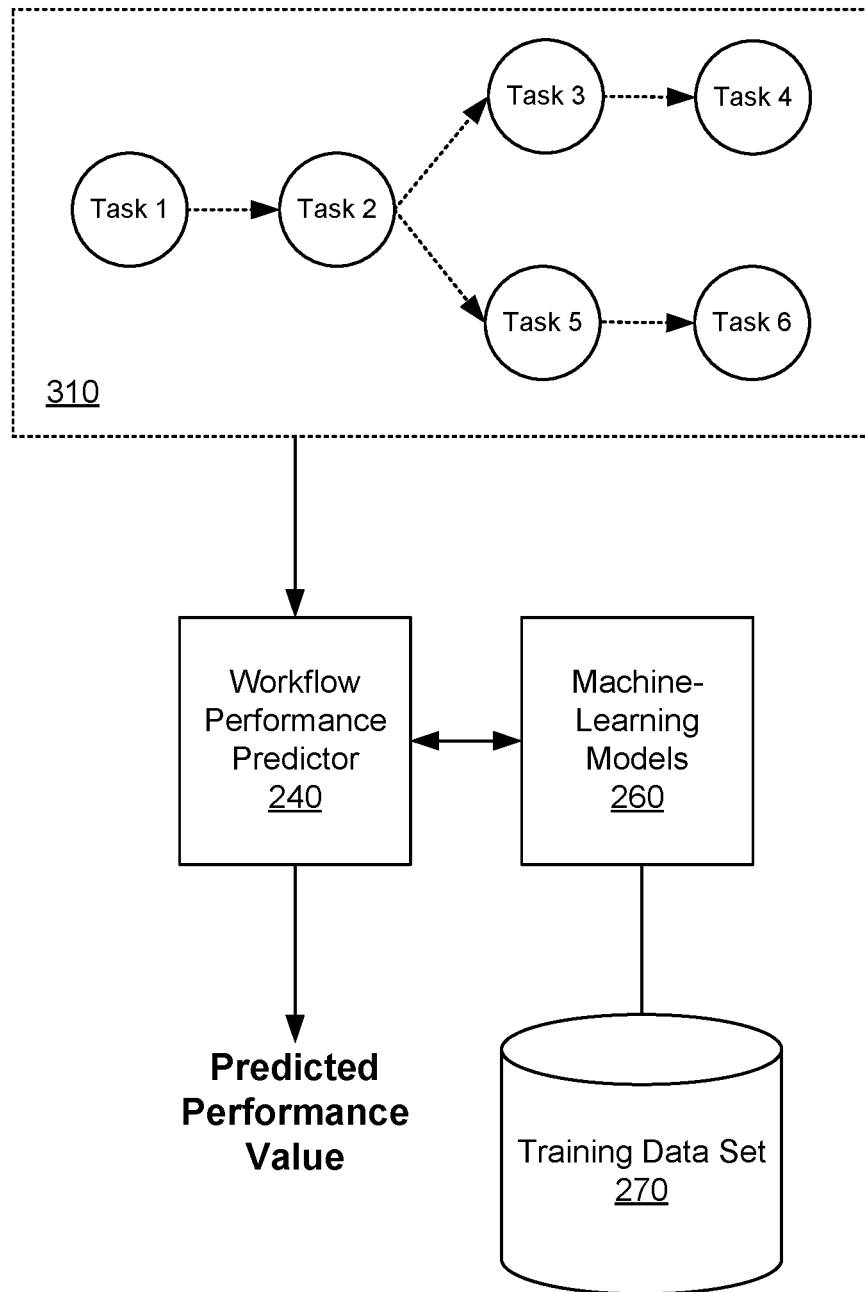
FIG. 3 illustrates an example of a process flow for generating predictions of task outcomes of communication workflows, according to some aspects of the present disclosure.

FIG. 3 is a diagram illustrating an example of a process flow 300 for generating predictions of task outcomes (e.g., overall performance) of communication workflows, according to some aspects of the present disclosure. Process flow 300 may be performed, at least in part, by any component described in FIGS. 1-2, for example. Further, process flow 300 may be performed to generate an output predictive of the task outcome of a new communication workflow.

Process flow 300 may begin where a user operates an interface provided by cloud-based application 120 to create a new communication workflow 310. As an illustrative example, the new communication workflow 310 may include an ordered sequence of Tasks 1 through 5, in which Task 1 is a start task that initiates the workflow, Task 2 is a split task that splits a target group of user devices into two sub-groups, Task 3 may be a communication task that transmits an email to the sub-group of user devices associated with Task 3, Task 4 may be an end node that ends the workflow, Task 5 may be a communication task that transmits a text message to the other sub-group of user devices associated with Task 5, and Task 6 may be an end node that ends the workflow. Cloud-based application 120 may use workflow structure generator 210 to generate the structure of new communication workflow 310.

The new communication workflow 310 may be inputted into workflow performance predictor 240 to generate a predicted performance value. The predicted performance value may represent the predicted task outcome of the new communication workflow 310, such as a percentage of users who perform a target action in response to receiving a communication triggered by a task included in the workflow, such as Tasks 3 or 5. Workflow performance predictor 240 may receive a composite feature vector of new communication workflow 310 generated by feature vector generator 220, and input the composite feature vector into a trained machine-learning model stored at machine-learning models 260. In response to receiving the composite feature vector of the new communication workflow 310, the trained machine-learning model may generate an output of a predicted performance of the new communication workflow 310.

Figure 4:
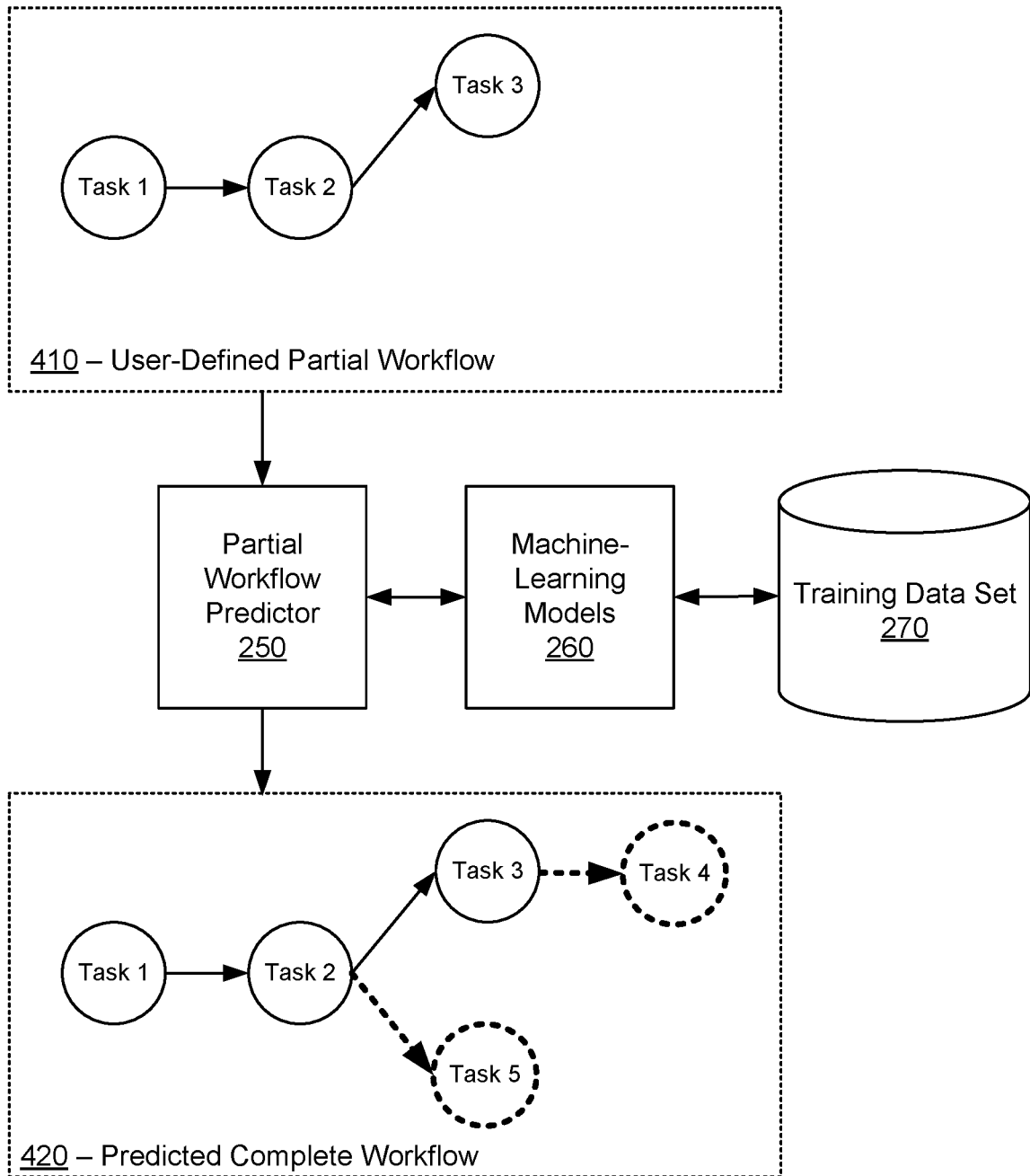
FIG. 4 illustrates an example of a process flow for generating recommendations of tasks to complete partial communication workflows, according to some aspects of the present disclosure.

FIG. 4 is a diagram illustrating an example of a process flow 400 for generating recommendations of tasks for including in partial communication workflows, according to some aspects of the present disclosure. Process flow 400 may be performed, at least in part, by any component described in FIGS. 1-2, for example. Further, process flow 400 may be performed to generate a recommendation of one or more tasks to include in a partial communication workflow.

Process flow 400 may begin where a user operates an interface provided by cloud-based application 120 to create a new partial workflow 410. As an illustrative example, the new partial workflow 410 may include an ordered sequence of Tasks 1 through 3, in which Task 1 is a start task that initiates the workflow, Task 2 is a split task that splits a target group of user devices into two sub-groups, and Task 3 may be a communication task that transmits an email to the sub-group of user devices associated with Task 3. Cloud-based application 120 may use workflow structure generator 210 to generate the structure of new partial workflow 410.

The new partial workflow 410 may be inputted into partial workflow predictor 250 to generate a recommendation of one or more tasks that would complete the new partial workflow 410. Partial workflow predictor 250 may receive a composite feature vector of the new partial workflow 410 generated by feature vector generator 220. Partial workflow predictor 250 may identify a set of partial portions of previously-executed communication workflows stored in training data set 270 that have the same structure as the new partial workflow 410. Partial workflow predictor 250 may then determine one or more partial portions of previously-executed communication workflows that are similar to the composite feature vector of the new partial workflow 410 using the similarity detection techniques described above. Partial workflow predictor 250 may rank the partial portions of previously-executed communication workflows that are determined to be similar by performance. For example, the top performing partial portion of a previously-executed communication workflow may be selected. The remaining tasks of that selected partial portion of a previously-executed communication workflow may be recommended for completing the new partial workflow 410. As an illustrated example, Task 4 and Task 5 may be recommended for including in the new partial workflow 410 to generate the complete workflow 420.

Figure 5:
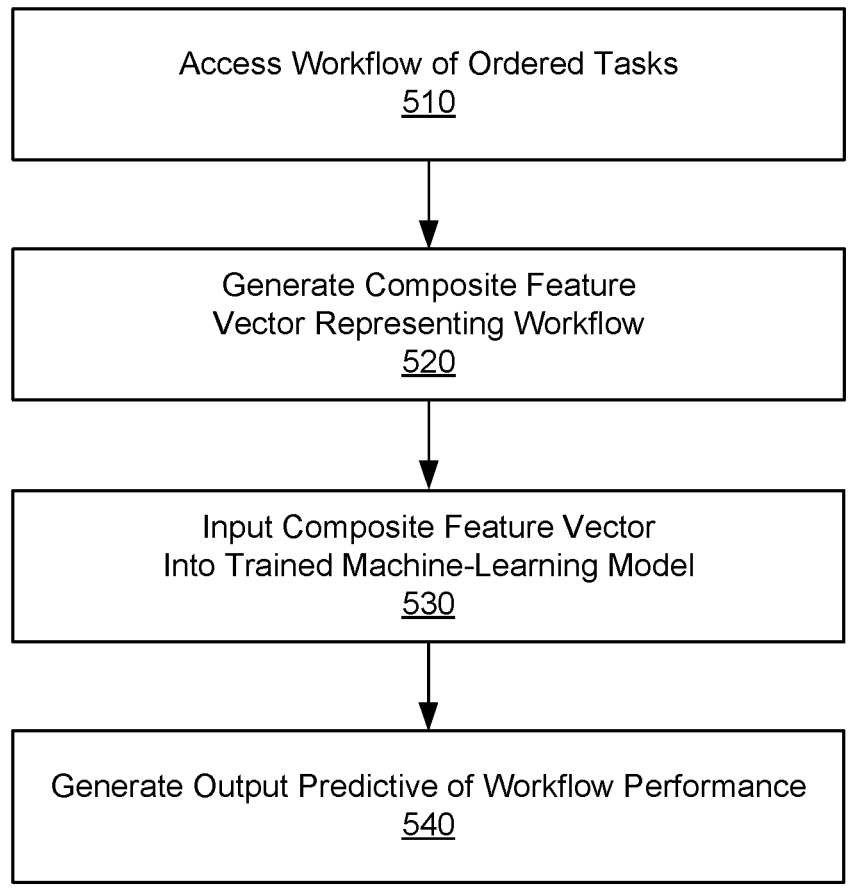
FIG. 5 is a flowchart illustrating an example process for generating predictions of task outcomes of communication workflows, according to some aspects of the present disclosure.

FIG. 5 is a flowchart illustrating an example of process 500 for generating an output predicting a task outcome of a communication workflow, according to some aspects of the present disclosure. In some implementations, process 500 may be performed by any component described in FIGS. 1-2. For example, process 500 may be performed by cloud-based application 120 and any of the corresponding sub-components. Further, as a non-limiting example, process 500 may be performed to generate a prediction of a value that represents a predicted task outcome of executing a communication workflow for a target group of user devices using machine-learning techniques.

For example, process 500 may begin at block 510, where cloud-based application 120 may receive or access a communication workflow including an ordered sequence of one or more tasks. The ordered sequence of tasks may represent a structure, such as a hierarchical tree structure. The cloud-based application 120 may generate an interface that enables a user to create a communication workflow by selecting tasks and arranging the tasks in an ordered sequence.

At block 520, feature vector generator 220 may evaluate the selected tasks and the ordered sequence of tasks to generate a composite feature vector representing the communication workflow. For example, feature vector generator 220 may generate a vector to represent each task using techniques, such as Word2Vec, topic modeling, Singular Value Decomposition (SVD), neural network for image representation (e.g., in the example of a task being a message that includes an image), and other suitable techniques. Feature vector generator 220 may then generate a composite feature vector based on a combination of the vector generated for each task.

At block 530, the workflow performance predictor 240 may input the composite feature vector of the communication workflow into a trained machine-learning model stored at machine-learning models 260. In some examples, the trained machine-learning model may be a supervised learning model, such as a linear regression models, Support Vector Machines (SVM), logistic regression, naïve Bayes, decision tree models, k-nearest neighbor models, neural networks, similarity learning, and other suitable models. The supervised learning model may be trained using labeled data. For example, each previously-executed communication workflow may be labeled with its corresponding performance value (e.g., click rate) based on the known task outcomes of the previously-executed communication workflows. The supervised learning model may learn to classify or predict the performance value of a communication workflow. At block 540, the workflow performance predictor 240 may generate an output corresponding to a prediction of a performance value of the communication workflow.

Figure 6:
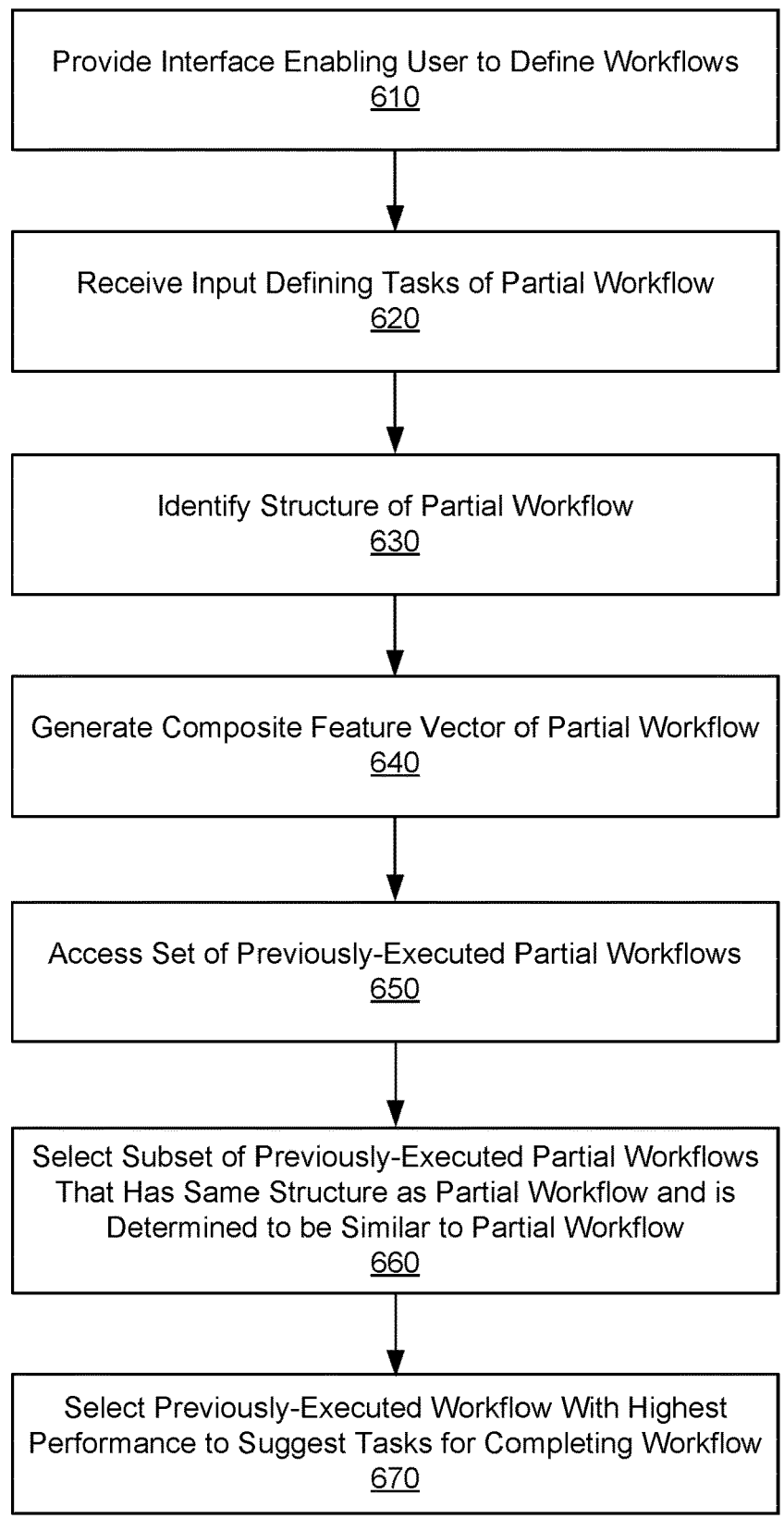
FIG. 6 is a flowchart illustrating an example process for generating recommendations of tasks to complete partial communication workflows, according to some aspects of the present disclosure.

FIG. 6 is a flowchart illustrating an example of process 600 for generating a recommendation of tasks to include in a new partial communication workflow, according to some aspects of the present disclosure. In some implementations, process 600 may be performed by any component described in FIGS. 1-2. For example, process 600 may be performed by cloud-based application 120 and any of the corresponding sub-components. Further, as a non-limiting example, process 600 may be performed to generate a recommendation to a user of one or more tasks to add into a new partial communication workflow.

For example, process 600 may begin at block 610, where cloud-based application 120 may generate and facilitate displaying of an interface that enables users to define communication workflows. At block 620, the user may navigate the interface to select tasks and arrange the selected tasks in an ordered sequence, which represent an incomplete or partial communication workflow. The interface may receive user input corresponding to the partial communication workflow. The partial communication workflow may be associated with one or more parameters that characterize each task of the one or more tasks of the partial communication workflow. For example, the parameters may include vocabularies for topic-modeling, content images of digital messages, and other suitable characteristics of the tasks.

At block 630, workflow structure generator 210 may evaluate the partial communication workflow to identify or generate a structure for the partial communication workflow. For example, the structure may be a hierarchical tree structure that includes a root node, one or more intermediate nodes, and one or more leaf nodes. The root node may represent a start task that initiates the partial communication workflow. The intermediate nodes may be any type of task, such as a split task that splits a target group of user devices into two or more sub-groups, a filter task that filters the target group of user devices, a communication task that transmits a communication to the target group of user devices, and so on. The leaf node may be an end node that represents the end of the communication workflow. The partial communication workflow may not yet include an end node because the workflow is partial or incomplete. In some examples, the structure of the partial communication workflow may be represented by one or more nodes and/or one or more stages. Each task of the one or more tasks of the partial workflow may correspond to a node of the one or more nodes or a stage of the one or more stages.

At block 640, the feature vector generator 220 may evaluate the selected tasks and the ordered sequence of tasks to generate a composite feature vector representing the partial communication workflow. For example, feature vector generator 220 may generate a vector to represent each task using techniques, such as Word2Vec, topic modeling, Singular Value Decomposition (SVD), neural network for image representation (e.g., in the example of a task being a message that includes an image), and other suitable techniques. Feature vector generator 220 may then generate a composite feature vector based on a combination of the vector generated for each task.

At block 650, partial workflow predictor 250 may access a set of previously-executed partial workflows of the training data set 270. Each previously-executed partial workflow of the set of previously-executed partial workflows may be represented by a structure, a composite feature vector, and a performance value (e.g., a task outcome). At block 660, partial workflow predictor 250 may select a subset of the set of previously-executed partial workflows. The subset of previously-executed partial workflows that is selected may share a same structure with the partial workflow. Partial workflow predictor 250 may determine, from the subset of previously-executed partial workflows, one or more previously-executed partial workflows that are similar to the partial workflow. The similarity may be determined based on a comparison between the composite feature vector of each previously-executed partial workflow of the subset and the composite feature vector of the partial workflow or any other similarity determination technique described above with respect to FIG. 2.

At block 670, partial workflow predictor 250 may generate a recommendation of one or more recommended tasks for completing the partial workflow. The one or more recommended tasks may be selected from one or more remaining tasks of a previously-executed partial workflow of the one or more previously-executed partial workflows that share the same structure with the partial workflow, that are determined to be similar to the partial workflow, and that has the highest performance value. The selection of the recommended tasks may be based on the previous performance values of the one or more previously-executed partial workflows that share the same structure with the partial workflow and that are determined to be similar to the partial workflow.

Figure 7:
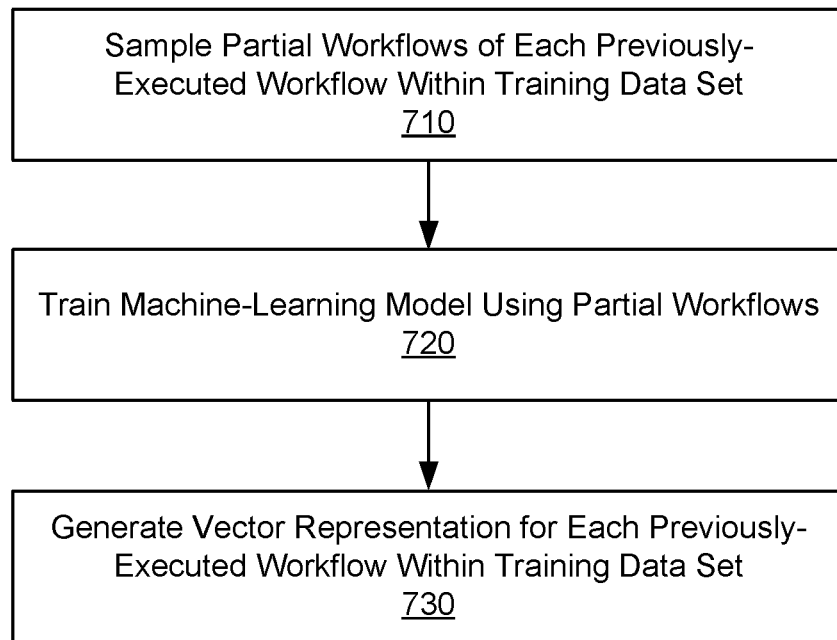
FIG. 7 is a flowchart illustrating an example process for generating vector representations of communication workflows, according to some aspects of the present disclosure.

FIG. 7 is a flowchart illustrating an example of process 700 for generating a vector representation of a communication workflow, according to some aspects of the present disclosure. In some implementations, process 700 may be performed by any component described in FIGS. 1-2. For example, process 700 may be performed by cloud-based application 120 and any of the corresponding sub-components. Further, as a non-limiting example, process 700 may be performed to generate a vector representation of a communication workflow using a graph-based learning model (e.g., Graph2Vec). The graph-based learning model may generate a multi-dimension vector representation of the structure and the tasks of the communication workflow using neural networks. The vector representation of the communication workflow as generated by process 700 may be inputted into workflow performance predictor 240 and partial workflow predictor 250 to generate performance predictions and task recommendations, respectively.

For example, process 700 may begin at block 710, where cloud-based application 120 may generate graphs for each previously-executed workflows of the training data set 270. Given a graph representing a structure of a communication workflow, workflow representation system 230 may sample a number of rooted sub-graphs around different nodes of the graph. In some examples, a rooted subgraph may include a representation of a sub-graph, in which a node has been selected as the root node, and the one or more branches stemming out of that selected node may be learned. The nodes of a tree structure of a communication workflow may be iteratively selected as the root node for the neural network to learn the various branches stemming out of each rooted node. At block 720, workflow representation system 230 may use the sampled rooted sub-graphs to train an n-dimensional neural network. At block 730, training the neural network may include learning the sub-graphs embeddings of each node of each previously-executed communication workflow of the training data set 270. Further, using neural networks to learn the sub-graph embeddings may transform the nodes and stages of a tree structure representing a communication workflow into a vector space, while preserving the structure and metadata of the tree structure. A vector representation may be generated for each previously-executed communication workflow of the training data set 270 using the graph-based learning model. The vector representations stored in the training data set 270 may then be evaluated against a vector representation of a new communication workflow to perform the methods and processes described herein.

Figure 8:
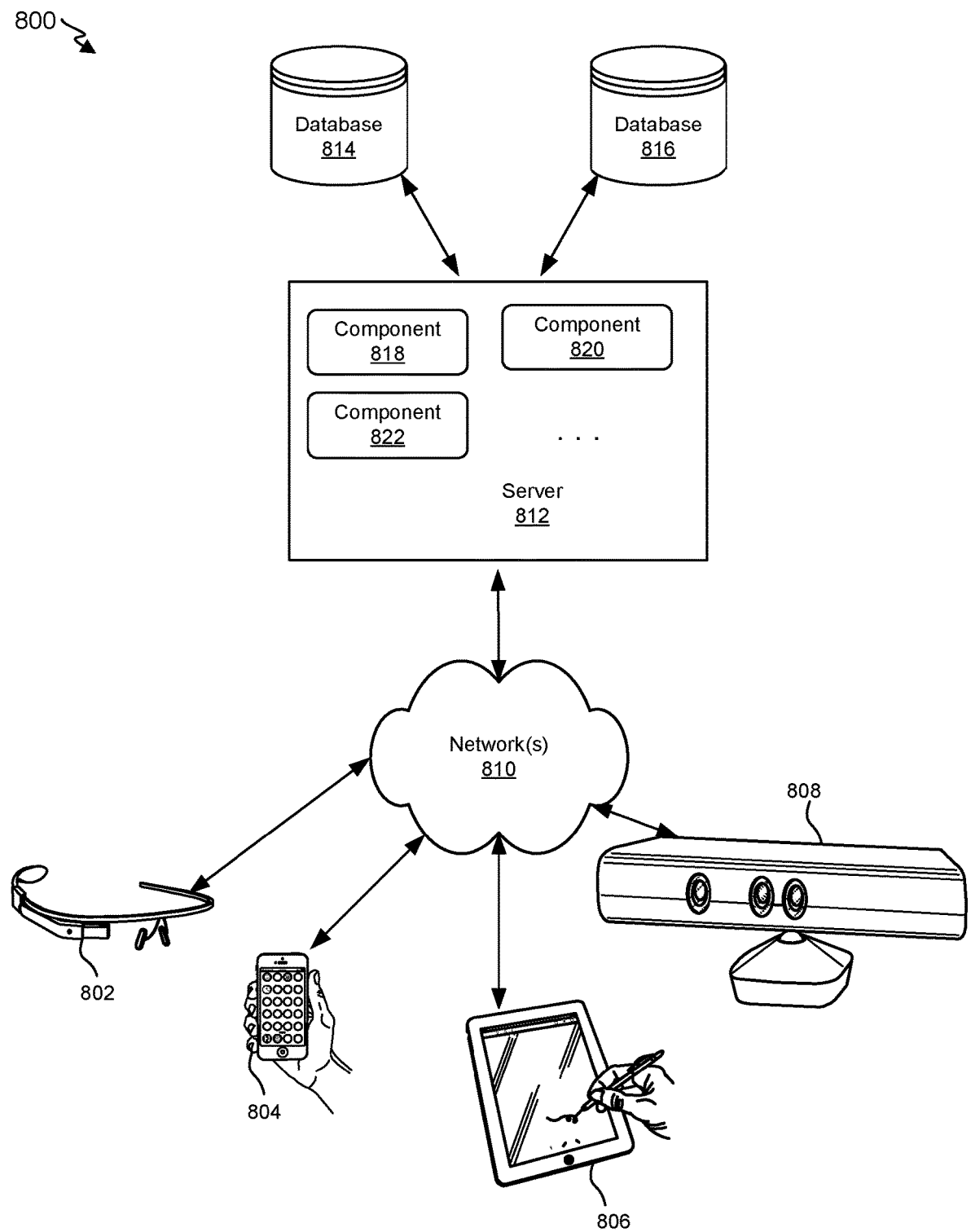
FIG. 8 is a simplified diagram illustrating a distributed system for implementing one of the embodiments.

FIG. 8 depicts a simplified diagram of a distributed system 800 for implementing one of the embodiments. In the illustrated embodiment, distributed system 800 includes one or more client computing devices 802, 804, 806, and 808, which are configured to execute and operate a client application such as a web browser, proprietary client (e.g., Oracle Forms), or the like over one or more network(s) 810. Server 812 may be communicatively coupled with remote client computing devices 802, 804, 806, and 808 via network 810.

In various embodiments, server 812 may be adapted to run one or more services or software applications provided by one or more of the components of the system. In some embodiments, these services may be offered as web-based or cloud services or under a Software as a Service (SaaS) model to the users of client computing devices 802, 804, 806, and/or 808. Users operating client computing devices 802, 804, 806, and/or 808 may in turn utilize one or more client applications to interact with server 812 to utilize the services provided by these components.

In the configuration depicted in the figure, the software components 818, 820 and 822 of system 800 are shown as being implemented on server 812. In other embodiments, one or more of the components of system 800 and/or the services provided by these components may also be implemented by one or more of the client computing devices 802, 804, 806, and/or 808. Users operating the client computing devices may then utilize one or more client applications to use the services provided by these components. These components may be implemented in hardware, firmware, software, or combinations thereof. It should be appreciated that various different system configurations are possible, which may be different from distributed system 800. The embodiment shown in the figure is thus one example of a distributed system for implementing an embodiment system and is not intended to be limiting.

Client computing devices 802, 804, 806, and/or 808 may be portable handheld devices (e.g., an iPhone®, cellular telephone, an iPad®, computing tablet, a personal digital assistant (PDA)) or wearable devices (e.g., a Google Glass® head mounted display), running software such as Microsoft Windows Mobile®, and/or a variety of mobile operating systems such as iOS, Windows Phone, Android, BlackBerry 10, Palm OS, and the like, and being Internet, e-mail, short message service (SMS), Blackberry®, or other communication protocol enabled. The client computing devices can be general purpose personal computers including, by way of example, personal computers and/or laptop computers running various versions of Microsoft Windows®, Apple Macintosh®, and/or Linux operating systems. The client computing devices can be workstation computers running any of a variety of commercially-available UNIX® or UNIX-like operating systems, including without limitation the variety of GNU/Linux operating systems, such as for example, Google Chrome OS. Alternatively, or in addition, client computing devices 802, 804, 806, and 808 may be any other electronic device, such as a thin-client computer, an Internet-enabled gaming system (e.g., a Microsoft Xbox gaming console with or without a Kinect® gesture input device), and/or a personal messaging device, capable of communicating over network(s) 810.

Although exemplary distributed system 800 is shown with four client computing devices, any number of client computing devices may be supported. Other devices, such as devices with sensors, etc., may interact with server 812.

Network(s) 810 in distributed system 800 may be any type of network familiar to those skilled in the art that can support data communications using any of a variety of commercially-available protocols, including without limitation TCP/IP (transmission control protocol/Internet protocol), SNA (systems network architecture), IPX (Internet packet exchange), AppleTalk, and the like. Merely by way of example, network(s) 810 can be a local area network (LAN), such as one based on Ethernet, Token-Ring and/or the like. Network(s) 810 can be a wide-area network and the Internet. It can include a virtual network, including without limitation a virtual private network (VPN), an intranet, an extranet, a public switched telephone network (PSTN), an infra-red network, a wireless network (e.g., a network operating under any of the Institute of Electrical and Electronics (IEEE) 802.11 suite of protocols, Bluetooth®, and/or any other wireless protocol); and/or any combination of these and/or other networks.

Server 812 may be composed of one or more general purpose computers, specialized server computers (including, by way of example, PC (personal computer) servers, UNIX® servers, mid-range servers, mainframe computers, rack-mounted servers, etc.), server farms, server clusters, or any other appropriate arrangement and/or combination. In various embodiments, server 812 may be adapted to run one or more services or software applications described in the foregoing disclosure. For example, server 812 may correspond to a server for performing processing described above according to an embodiment of the present disclosure.

Server 812 may run an operating system including any of those discussed above, as well as any commercially available server operating system. Server 812 may also run any of a variety of additional server applications and/or mid-tier applications, including HTTP (hypertext transport protocol) servers, FTP (file transfer protocol) servers, CGI (common gateway interface) servers, JAVA® servers, database servers, and the like. Exemplary database servers include without limitation those commercially available from Oracle, Microsoft, Sybase, IBM (International Business Machines), and the like.

In some implementations, server 812 may include one or more applications to analyze and consolidate data feeds and/or event updates received from users of client computing devices 802, 804, 806, and 808. As an example, data feeds and/or event updates may include, but are not limited to, Twitter® feeds, Facebook® updates or real-time updates received from one or more third party information sources and continuous data streams, which may include real-time events related to sensor data applications, financial tickers, network performance measuring tools (e.g., network monitoring and traffic management applications), clickstream analysis tools, automobile traffic monitoring, and the like. Server 812 may also include one or more applications to display the data feeds and/or real-time events via one or more display devices of client computing devices 802, 804, 806, and 808.

Distributed system 800 may also include one or more databases 814 and 816. Databases 814 and 816 may reside in a variety of locations. By way of example, one or more of databases 814 and 816 may reside on a non-transitory storage medium local to (and/or resident in) server 812. Alternatively, databases 814 and 816 may be remote from server 812 and in communication with server 812 via a network-based or dedicated connection. In one set of embodiments, databases 814 and 816 may reside in a storage-area network (SAN). Similarly, any necessary files for performing the functions attributed to server 812 may be stored locally on server 812 and/or remotely, as appropriate. In one set of embodiments, databases 814 and 816 may include relational databases, such as databases provided by Oracle, that are adapted to store, update, and retrieve data in response to SQL-formatted commands.

Figure 9:
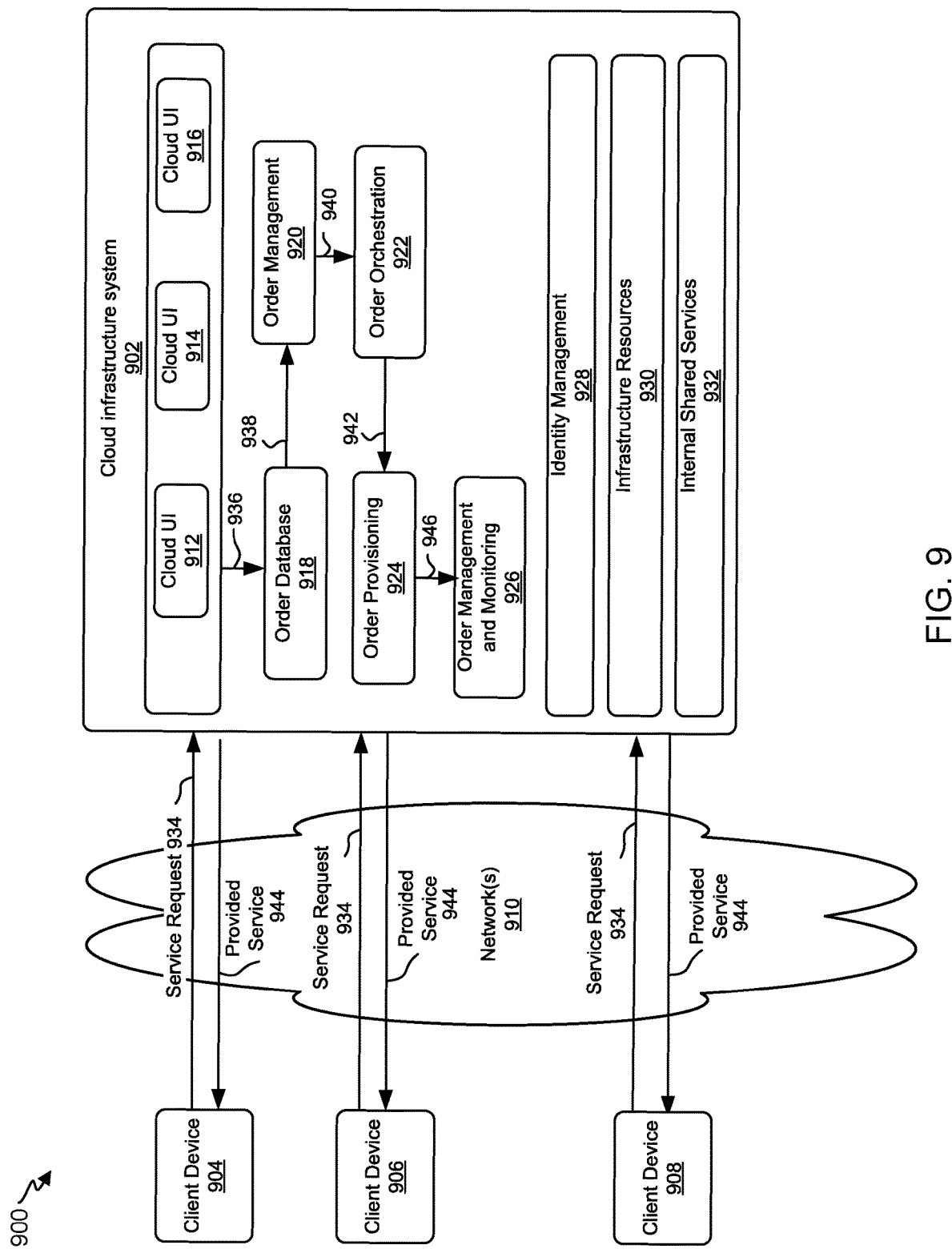
FIG. 9 is a simplified block diagram illustrating one or more components of a system environment.

FIG. 9 is a simplified block diagram of one or more components of a system environment 900 by which services provided by one or more components of an embodiment system may be offered as cloud services, in accordance with an embodiment of the present disclosure. In the illustrated embodiment, system environment 900 includes one or more client computing devices 904, 906, and 908 that may be used by users to interact with a cloud infrastructure system 902 that provides cloud services. The client computing devices may be configured to operate a client application such as a web browser, a proprietary client application (e.g., Oracle Forms), or some other application, which may be used by a user of the client computing device to interact with cloud infrastructure system 902 to use services provided by cloud infrastructure system 902.

It should be appreciated that cloud infrastructure system 902 depicted in the figure may have other components than those depicted. Further, the embodiment shown in the figure is only one example of a cloud infrastructure system that may incorporate an embodiment of the invention. In some other embodiments, cloud infrastructure system 902 may have more or fewer components than shown in the figure, may combine two or more components, or may have a different configuration or arrangement of components.

Client computing devices 904, 906, and 908 may be devices similar to those described above for 802, 804, 806, and 808.

Although exemplary system environment 900 is shown with three client computing devices, any number of client computing devices may be supported. Other devices such as devices with sensors, etc. may interact with cloud infrastructure system 902.

Network(s) 910 may facilitate communications and exchange of data between clients 904, 906, and 908 and cloud infrastructure system 902. Each network may be any type of network familiar to those skilled in the art that can support data communications using any of a variety of commercially-available protocols, including those described above for network(s) 810.

Cloud infrastructure system 902 may comprise one or more computers and/or servers that may include those described above for server 812.

In certain embodiments, services provided by the cloud infrastructure system may include a host of services that are made available to users of the cloud infrastructure system on demand, such as online data storage and backup solutions, Web-based e-mail services, hosted office suites and document collaboration services, database processing, managed technical support services, and the like. Services provided by the cloud infrastructure system can dynamically scale to meet the needs of its users. A specific instantiation of a service provided by cloud infrastructure system is referred to herein as a "service instance." In general, any service made available to a user via a communication network, such as the Internet, from a cloud service provider's system is referred to as a "cloud service." Typically, in a public cloud environment, servers and systems that make up the cloud service provider's system are different from the customer's own on-premises servers and systems. For example, a cloud service provider's system may host an application, and a user may, via a communication network such as the Internet, on demand, order and use the application.

In some examples, a service in a computer network cloud infrastructure may include protected computer network access to storage, a hosted database, a hosted web server, a software application, or other service provided by a cloud vendor to a user, or as otherwise known in the art. For example, a service can include password-protected access to remote storage on the cloud through the Internet. As another example, a service can include a web service-based hosted relational database and a script-language middleware engine for private use by a networked developer. As another example, a service can include access to an email software application hosted on a cloud vendor's web site.

In certain embodiments, cloud infrastructure system 902 may include a suite of applications, middleware, and database service offerings that are delivered to a customer in a self-service, subscription-based, elastically scalable, reliable, highly available, and secure manner. An example of such a cloud infrastructure system is the Oracle Public Cloud provided by the present assignee.

In various embodiments, cloud infrastructure system 902 may be adapted to automatically provision, manage and track a customer's subscription to services offered by cloud infrastructure system 902. Cloud infrastructure system 902 may provide the cloud services via different deployment models. For example, services may be provided under a public cloud model in which cloud infrastructure system 902 is owned by an organization selling cloud services (e.g., owned by Oracle) and the services are made available to the general public or different industry enterprises. As another example, services may be provided under a private cloud model in which cloud infrastructure system 902 is operated solely for a single organization and may provide services for one or more entities within the organization. The cloud services may also be provided under a community cloud model in which cloud infrastructure system 902 and the services provided by cloud infrastructure system 902 are shared by several organizations in a related community. The cloud services may also be provided under a hybrid cloud model, which is a combination of two or more different models.

In some embodiments, the services provided by cloud infrastructure system 802 may include one or more services provided under Software as a Service (SaaS) category, Platform as a Service (PaaS) category, Infrastructure as a Service (IaaS) category, or other categories of services including hybrid services. A customer, via a subscription order, may order one or more services provided by cloud infrastructure system 902. Cloud infrastructure system 902 then performs processing to provide the services in the customer's subscription order.

In some embodiments, the services provided by cloud infrastructure system 902 may include, without limitation, application services, platform services and infrastructure services. In some examples, application services may be provided by the cloud infrastructure system via a SaaS platform. The SaaS platform may be configured to provide cloud services that fall under the SaaS category. For example, the SaaS platform may provide capabilities to build and deliver a suite of on-demand applications on an integrated development and deployment platform. The SaaS platform may manage and control the underlying software and infrastructure for providing the SaaS services. By utilizing the services provided by the SaaS platform, customers can utilize applications executing on the cloud infrastructure system. Customers can acquire the application services without the need for customers to purchase separate licenses and support. Various different SaaS services may be provided. Examples include, without limitation, services that provide solutions for sales performance management, enterprise integration, and flexibility for large organizations.

In some embodiments, platform services may be provided by the cloud infrastructure system via a PaaS platform. The PaaS platform may be configured to provide cloud services that fall under the PaaS category. Examples of platform services may include without limitation services that enable organizations (such as Oracle) to consolidate existing applications on a shared, common architecture, as well as the ability to build new applications that leverage the shared services provided by the platform. The PaaS platform may manage and control the underlying software and infrastructure for providing the PaaS services. Customers can acquire the PaaS services provided by the cloud infrastructure system without the need for customers to purchase separate licenses and support. Examples of platform services include, without limitation, Oracle Java Cloud Service (JCS), Oracle Database Cloud Service (DBCS), and others.

By utilizing the services provided by the PaaS platform, customers can employ programming languages and tools supported by the cloud infrastructure system and also control the deployed services. In some embodiments, platform services provided by the cloud infrastructure system may include database cloud services, middleware cloud services (e.g., Oracle Fusion Middleware services), and Java cloud services. In one embodiment, database cloud services may support shared service deployment models that enable organizations to pool database resources and offer customers a Database as a Service in the form of a database cloud. Middleware cloud services may provide a platform for customers to develop and deploy various cloud applications, and Java cloud services may provide a platform for customers to deploy Java applications, in the cloud infrastructure system.

Various different infrastructure services may be provided by an IaaS platform in the cloud infrastructure system. The infrastructure services facilitate the management and control of the underlying computing resources, such as storage, networks, and other fundamental computing resources for customers utilizing services provided by the SaaS platform and the PaaS platform.

In certain embodiments, cloud infrastructure system 902 may also include infrastructure resources 930 for providing the resources used to provide various services to customers of the cloud infrastructure system. In one embodiment, infrastructure resources 930 may include pre-integrated and optimized combinations of hardware, such as servers, storage, and networking resources to execute the services provided by the PaaS platform and the SaaS platform.

In some embodiments, resources in cloud infrastructure system 902 may be shared by multiple users and dynamically re-allocated per demand. Additionally, resources may be allocated to users in different time zones. For example, cloud infrastructure system 930 may enable a first set of users in a first time zone to utilize resources of the cloud infrastructure system for a specified number of hours and then enable the re-allocation of the same resources to another set of users located in a different time zone, thereby maximizing the utilization of resources.

In certain embodiments, a number of internal shared services 932 may be provided that are shared by different components or modules of cloud infrastructure system 902 and by the services provided by cloud infrastructure system 902. These internal shared services may include, without limitation, a security and identity service, an integration service, an enterprise repository service, an enterprise manager service, a virus scanning and white list service, a high availability, backup and recovery service, service for enabling cloud support, an email service, a notification service, a file transfer service, and the like.

In certain embodiments, cloud infrastructure system 902 may provide comprehensive management of cloud services (e.g., SaaS, PaaS, and IaaS services) in the cloud infrastructure system. In one embodiment, cloud management functionality may include capabilities for provisioning, managing and tracking a customer's subscription received by cloud infrastructure system 902, and the like.

In one embodiment, as depicted in the figure, cloud management functionality may be provided by one or more modules, such as an order management module 920, an order orchestration module 922, an order provisioning module 924, an order management and monitoring module 926, and an identity management module 928. These modules may include or be provided using one or more computers and/or servers, which may be general purpose computers, specialized server computers, server farms, server clusters, or any other appropriate arrangement and/or combination.

In exemplary operation 934, a customer using a client device, such as client device 904, 906 or 908, may interact with cloud infrastructure system 902 by requesting one or more services provided by cloud infrastructure system 902 and placing an order for a subscription for one or more services offered by cloud infrastructure system 902. In certain embodiments, the customer may access a cloud User Interface (UI), cloud UI 912, cloud UI 914 and/or cloud UI 916 and place a subscription order via these UIs. The order information received by cloud infrastructure system 802 in response to the customer placing an order may include information identifying the customer and one or more services offered by the cloud infrastructure system 902 that the customer intends to subscribe to.

After an order has been placed by the customer, the order information is received via the cloud UIs, 912, 914 and/or 916.

At operation 936, the order is stored in order database 918. Order database 918 can be one of several databases operated by cloud infrastructure system 918 and operated in conjunction with other system elements.

At operation 938, the order information is forwarded to an order management module 920. In some instances, order management module 920 may be configured to perform billing and accounting functions related to the order, such as verifying the order, and upon verification, booking the order.

At operation 940, information regarding the order is communicated to an order orchestration module 922. Order orchestration module 922 may utilize the order information to orchestrate the provisioning of services and resources for the order placed by the customer. In some instances, order orchestration module 922 may orchestrate the provisioning of resources to support the subscribed services using the services of order provisioning module 924.

In certain embodiments, order orchestration module 922 enables the management of processes associated with each order and applies logic to determine whether an order should proceed to provisioning. At operation 942, upon receiving an order for a new subscription, order orchestration module 922 sends a request to order provisioning module 924 to allocate resources and configure those resources needed to fulfill the subscription order. Order provisioning module 924 enables the allocation of resources for the services ordered by the customer. Order provisioning module 924 provides a level of abstraction between the cloud services provided by cloud infrastructure system 900 and the physical implementation layer that is used to provision the resources for providing the requested services. Order orchestration module 922 may thus be isolated from implementation details, such as whether or not services and resources are actually provisioned on the fly or pre-provisioned and only allocated/assigned upon request.

At operation 944, once the services and resources are provisioned, a notification of the provided service may be sent to customers on client devices 904, 906 and/or 908 by order provisioning module 924 of cloud infrastructure system 902.

At operation 946, the customer's subscription order may be managed and tracked by an order management and monitoring module 926. In some instances, order management and monitoring module 926 may be configured to collect usage statistics for the services in the subscription order, such as the amount of storage used, the amount data transferred, the number of users, and the amount of system up time and system down time.

In certain embodiments, cloud infrastructure system 900 may include an identity management module 928. Identity management module 928 may be configured to provide identity services, such as access management and authorization services in cloud infrastructure system 900. In some embodiments, identity management module 928 may control information about customers who wish to utilize the services provided by cloud infrastructure system 902. Such information can include information that authenticates the identities of such customers and information that describes which actions those customers are authorized to perform relative to various system resources (e.g., files, directories, applications, communication ports, memory segments, etc.) Identity management module 928 may also include the management of descriptive information about each customer and about how and by whom that descriptive information can be accessed and modified.

Figure 10:
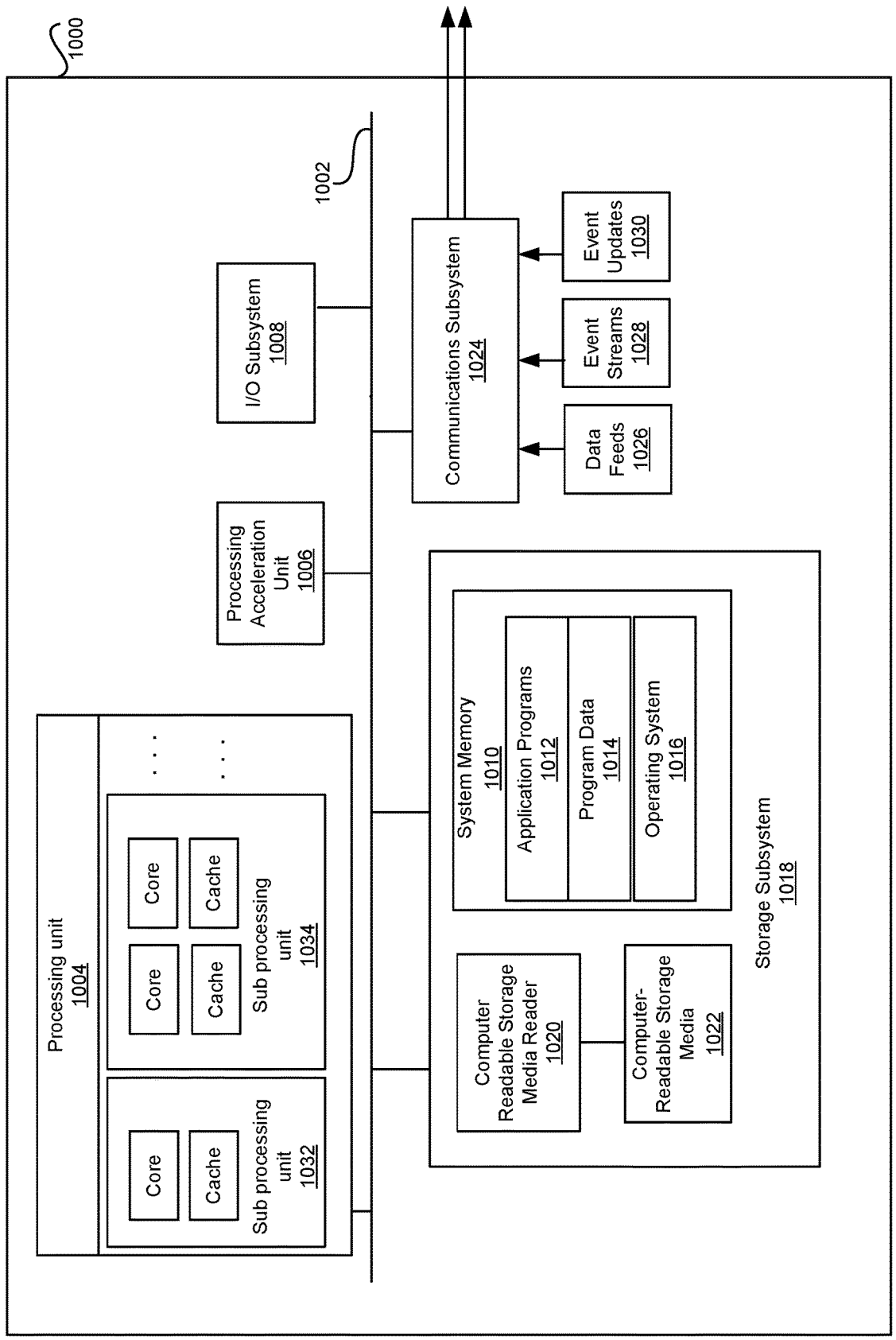
FIG. 10 illustrates an exemplary computer system, in which various embodiments of the present invention may be implemented.

FIG. 10 illustrates an exemplary computer system 1000, in which various embodiments of the present invention may be implemented. The system 1000 may be used to implement any of the computer systems described above. As shown in the figure, computer system 1000 includes a processing unit 1004 that communicates with a number of peripheral subsystems via a bus subsystem 1002. These peripheral subsystems may include a processing acceleration unit 1006, an I/O subsystem 1008, a storage subsystem 1018 and a communications subsystem 1024. Storage subsystem 1018 includes tangible computer-readable storage media 1022 and a system memory 1010.

Bus subsystem 1002 provides a mechanism for letting the various components and subsystems of computer system 1000 communicate with each other as intended. Although bus subsystem 1002 is shown schematically as a single bus, alternative embodiments of the bus subsystem may utilize multiple buses. Bus subsystem 1002 may be any of several types of bus structures including a memory bus or memory controller, a peripheral bus, and a local bus using any of a variety of bus architectures. For example, such architectures may include an Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, which can be implemented as a Mezzanine bus manufactured to the IEEE P1386.1 standard.

Processing unit 1004, which can be implemented as one or more integrated circuits (e.g., a conventional microprocessor or microcontroller), controls the operation of computer system 1000. One or more processors may be included in processing unit 1004. These processors may include single core or multicore processors. In certain embodiments, processing unit 1004 may be implemented as one or more independent processing units 1032 and/or 1034 with single or multicore processors included in each processing unit. In other embodiments, processing unit 1004 may also be implemented as a quad-core processing unit formed by integrating two dual-core processors into a single chip.

In various embodiments, processing unit 1004 can execute a variety of programs in response to program code and can maintain multiple concurrently executing programs or processes. At any given time, some or all of the program code to be executed can be resident in processor(s) 1004 and/or in storage subsystem 1018. Through suitable programming, processor(s) 1004 can provide various functionalities described above. Computer system 1000 may additionally include a processing acceleration unit 1006, which can include a digital signal processor (DSP), a special-purpose processor, and/or the like.

I/O subsystem 1008 may include user interface input devices and user interface output devices. User interface input devices may include a keyboard, pointing devices such as a mouse or trackball, a touchpad or touch screen incorporated into a display, a scroll wheel, a click wheel, a dial, a button, a switch, a keypad, audio input devices with voice command recognition systems, microphones, and other types of input devices. User interface input devices may include, for example, motion sensing and/or gesture recognition devices such as the Microsoft Kinect® motion sensor that enables users to control and interact with an input device, such as the Microsoft Xbox® 360 game controller, through a natural user interface using gestures and spoken commands. User interface input devices may also include eye gesture recognition devices such as the Google Glass® blink detector that detects eye activity (e.g., 'blinking' while taking pictures and/or making a menu selection) from users and transforms the eye gestures as input into an input device (e.g., Google Glass®). Additionally, user interface input devices may include voice recognition sensing devices that enable users to interact with voice recognition systems (e.g., Siri® navigator), through voice commands.

User interface input devices may also include, without limitation, three dimensional (3D) mice, joysticks or pointing sticks, gamepads and graphic tablets, and audio/visual devices such as speakers, digital cameras, digital camcorders, portable media players, webcams, image scanners, fingerprint scanners, barcode reader 3D scanners, 3D printers, laser rangefinders, and eye gaze tracking devices. Additionally, user interface input devices may include, for example, medical imaging input devices such as computed tomography, magnetic resonance imaging, position emission tomography, medical ultrasonography devices. User interface input devices may also include, for example, audio input devices such as MIDI keyboards, digital musical instruments and the like.

User interface output devices may include a display subsystem, indicator lights, or non-visual displays such as audio output devices, etc. The display subsystem may be a cathode ray tube (CRT), a flat-panel device, such as that using a liquid crystal display (LCD) or plasma display, a projection device, a touch screen, and the like. In general, use of the term "output device" is intended to include all possible types of devices and mechanisms for outputting information from computer system 1000 to a user or other computer. For example, user interface output devices may include, without limitation, a variety of display devices that visually convey text, graphics and audio/video information such as monitors, printers, speakers, headphones, automotive navigation systems, plotters, voice output devices, and modems.

Computer system 1000 may comprise a storage subsystem 1018 that comprises software elements, shown as being currently located within a system memory 1010. System memory 1010 may store program instructions that are loadable and executable on processing unit 1004, as well as data generated during the execution of these programs.

Depending on the configuration and type of computer system 1000, system memory 1010 may be volatile (such as random access memory (RAM)) and/or non-volatile (such as read-only memory (ROM), flash memory, etc.) The RAM typically contains data and/or program modules that are immediately accessible to and/or presently being operated and executed by processing unit 1004. In some implementations, system memory 1010 may include multiple different types of memory, such as static random access memory (SRAM) or dynamic random access memory (DRAM). In some implementations, a basic input/output system (BIOS), containing the basic routines that help to transfer information between elements within computer system 1000, such as during start-up, may typically be stored in the ROM. By way of example, and not limitation, system memory 1010 also illustrates application programs 1012, which may include client applications, Web browsers, mid-tier applications, relational database management systems (RDBMS), etc., program data 1014, and an operating system 1016. By way of example, operating system 1016 may include various versions of Microsoft Windows®, Apple Macintosh®, and/or Linux operating systems, a variety of commercially-available UNIX® or UNIX-like operating systems (including without limitation the variety of GNU/Linux operating systems, the Google Chrome® OS, and the like) and/or mobile operating systems such as iOS, Windows® Phone, Android® OS, BlackBerry® 10 OS, and Palm® OS operating systems.

Storage subsystem 1018 may also provide a tangible computer-readable storage medium for storing the basic programming and data constructs that provide the functionality of some embodiments. Software (programs, code modules, instructions) that when executed by a processor provide the functionality described above may be stored in storage subsystem 1018. These software modules or instructions may be executed by processing unit 1004. Storage subsystem 1018 may also provide a repository for storing data used in accordance with the present invention.

Storage subsystem 1018 may also include a computer-readable storage media reader 1020 that can further be connected to computer-readable storage media 1022. Together and, optionally, in combination with system memory 1010, computer-readable storage media 1022 may comprehensively represent remote, local, fixed, and/or removable storage devices plus storage media for temporarily and/or more permanently containing, storing, transmitting, and retrieving computer-readable information.

Computer-readable storage media 1022 containing code, or portions of code, can also include any appropriate media known or used in the art, including storage media and communication media, such as but not limited to, volatile and non-volatile, removable and non-removable media implemented in any method or technology for storage and/or transmission of information. This can include tangible computer-readable storage media such as RAM, ROM, electronically erasable programmable ROM (EEPROM), flash memory or other memory technology, CD-ROM, digital versatile disk (DVD), or other optical storage, magnetic cassettes, magnetic tape, magnetic disk storage or other magnetic storage devices, or other tangible computer readable media. This can also include nontangible computer-readable media, such as data signals, data transmissions, or any other medium which can be used to transmit the desired information and which can be accessed by computing system 1000.

By way of example, computer-readable storage media 1022 may include a hard disk drive that reads from or writes to non-removable, nonvolatile magnetic media, a magnetic disk drive that reads from or writes to a removable, non-volatile magnetic disk, and an optical disk drive that reads from or writes to a removable, nonvolatile optical disk such as a CD ROM, DVD, and Blu-Ray® disk, or other optical media. Computer-readable storage media 1022 may include, but is not limited to, Zip® drives, flash memory cards, universal serial bus (USB) flash drives, secure digital (SD) cards, DVD disks, digital video tape, and the like. Computer-readable storage media 1022 may also include, solid-state drives (SSD) based on non-volatile memory such as flash-memory based SSDs, enterprise flash drives, solid state ROM, and the like, SSDs based on volatile memory such as solid state RAM, dynamic RAM, static RAM, DRAM-based SSDs, magnetoresistive RAM (MRAM) SSDs, and hybrid SSDs that use a combination of DRAM and flash memory based SSDs. The disk drives and their associated computer-readable media may provide non-volatile storage of computer-readable instructions, data structures, program modules, and other data for computer system 1000.

Communications subsystem 1024 provides an interface to other computer systems and networks. Communications subsystem 1024 serves as an interface for receiving data from and transmitting data to other systems from computer system 1000. For example, communications subsystem 924 may enable computer system 1000 to connect to one or more devices via the Internet. In some embodiments communications subsystem 1024 can include radio frequency (RF) transceiver components for accessing wireless voice and/or data networks (e.g., using cellular telephone technology, advanced data network technology, such as 3G, 4G or EDGE (enhanced data rates for global evolution), WiFi (IEEE 1202.11 family standards, or other mobile communication technologies, or any combination thereof), global positioning system (GPS) receiver components, and/or other components. In some embodiments communications subsystem 1024 can provide wired network connectivity (e.g., Ethernet) in addition to or instead of a wireless interface.

In some embodiments, communications subsystem 1024 may also receive input communication in the form of structured and/or unstructured data feeds 1026, event streams 1028, event updates 1030, and the like on behalf of one or more users who may use computer system 1000.

By way of example, communications subsystem 1024 may be configured to receive data feeds 1026 in real-time from users of social networks and/or other communication services such as Twitter® feeds, Facebook® updates, web feeds such as Rich Site Summary (RSS) feeds, and/or real-time updates from one or more third party information sources.

Additionally, communications subsystem 1024 may also be configured to receive data in the form of continuous data streams, which may include event streams 1028 of real-time events and/or event updates 1030, that may be continuous or unbounded in nature with no explicit end. Examples of applications that generate continuous data may include, for example, sensor data applications, financial tickers, network performance measuring tools (e.g. network monitoring and traffic management applications), clickstream analysis tools, automobile traffic monitoring, and the like.

Communications subsystem 1024 may also be configured to output the structured and/or unstructured data feeds 1026, event streams 1028, event updates 1030, and the like to one or more databases that may be in communication with one or more streaming data source computers coupled to computer system 1000.

Computer system 1000 can be one of various types, including a handheld portable device (e.g., an iPhone® cellular phone, an iPad® computing tablet, a PDA), a wearable device (e.g., a Google Glass® head mounted display), a PC, a workstation, a mainframe, a kiosk, a server rack, or any other data processing system.

Due to the ever-changing nature of computers and networks, the description of computer system 1000 depicted in the figure is intended only as a specific example. Many other configurations having more or fewer components than the system depicted in the figure are possible. For example, customized hardware might also be used and/or particular elements might be implemented in hardware, firmware, software (including applets), or a combination. Further, connection to other computing devices, such as network input/output devices, may be employed. Based on the disclosure and teachings provided herein, a person of ordinary skill in the art will appreciate other ways and/or methods to implement the various embodiments.

In the foregoing specification, aspects of the invention are described with reference to specific embodiments thereof, but those skilled in the art will recognize that the invention is not limited thereto. Various features and aspects of the above-described invention may be used individually or jointly. Further, embodiments can be utilized in any number of environments and applications beyond those described herein without departing from the broader spirit and scope of the specification. The specification and drawings are, accordingly, to be regarded as illustrative rather than restrictive.

What is claimed is:

1. A computer-implemented method comprising:
accessing a communication workflow including one or more ordered sequence of tasks, the communication workflow being configured to facilitate interactions with a set of user devices over a communication channel that is selected based on the communication workflow, each task of the one or more ordered sequence of tasks including executable code that, upon execution, performs a function associated with the set of user devices, and the communication workflow being associated with one or more parameters that characterize each task of the one or more ordered sequence of tasks of the communication workflow;
identifying a structure of the communication workflow as a tree structure, wherein the tree structure includes a plurality of nodes and one or more stages, wherein two nodes of the plurality of nodes of the tree structure are connected by at least one stage of the one or more stages, and wherein each task of the one or more ordered sequence of tasks of the communication workflow corresponds to a node of the plurality of nodes or a stage of the one or more stages;
training a machine-learning model using one or more rooted sub-trees for each node or stage of the tree structure of previously executed communication workflows; and
generating a multi-dimensional vector representation as an output of the trained machine-learning model to represent the tasks, contents of the tasks and structure of the communication workflow, the multi-dimensional vector representation having been learned using the one or more rooted sub-trees of each node or stage of the tree structure, wherein the multi-dimensional vector representation is used to generate task recommendations and predictions of performance values that indicate a likelihood of receiving an interaction in response to performing a function of one or more corresponding tasks that comprise a non-terminating task of the communication workflow.

2. The computer-implemented method of claim 1, further comprising:
accessing a set of previously-executed communication workflows;
defining a tree structure for each previously-executed communication workflow of the set of previously-executed communication workflows;
inputting the tree structure of each previously-executed communication workflow of the set of previously-executed communication workflows into the machine-learning model;
generating a vector representation representing the tree structure of each previously-executed communication workflow of the set of previously-executed communication workflows; and
storing the vector representation of each previously-executed communication workflow in a training data set.

3. The computer-implemented method of claim 1, wherein the multi-dimensional vector representation of the tree structure is generated without evaluating a vector representation of an individual node of the plurality of nodes or of an individual stage of the one or more stages of the tree structure.

4. The computer-implemented method of claim 1, wherein each node of the plurality of nodes and each stage of the one or more stages of the tree structure is associated with metadata used to characterize the task or a portion of the communication workflow.

5. The computer-implemented method of claim 4, wherein the metadata associated with each node or stage represents a function performed by the task associated with the node or stage, respectively.

6. The computer-implemented method of claim 1, wherein the machine-learning model is a neural network configured to learn embeddings of the tree structure of the communication workflow.

7. The computer-implemented method of claim 1, further comprising:
extracting one or more rooted partial tree structures for each node of the plurality of nodes or each stage of the one or more stages of the tree structure of the communication workflow, each rooted partial tree structure of the one or more rooted partial tree structure including a set of nodes one or more hops away from the node or stage; and
training the machine-learning model using the one or more rooted partial tree structures.

8. The computer-implemented method of claim 1, further comprising:
determining that the tree structure of the communication workflow represents a partial workflow; and
generating, based on the predictions of performance values, one or more recommended tasks for completing the partial workflow.

9. A system, comprising:
one or more processors; and
a non-transitory computer-readable storage medium containing instructions which, when executed on the one or more processors, cause the one or more processors to perform operations including:
access a communication workflow including one or more ordered sequence of tasks, the communication workflow being configured to facilitate interactions with a set of user devices over a communication channel that is selected based on the communication workflow, each task of the one or more ordered sequence of tasks including executable code that, upon execution, performs a function associated with the set of user devices, and the communication workflow being associated with one or more parameters that characterize each task of the one or more ordered sequence of tasks of the communication workflow;

identify a structure of the communication workflow as a tree structure, wherein the tree structure includes a plurality of nodes and one or more stages, wherein two nodes of the plurality of nodes of the tree structure are connected by at least one stage of the one or more stages, and wherein each task of the one or more ordered sequence of tasks of the communication workflow corresponds to a node of the plurality of nodes or a stage of the one or more stages;

train a machine-learning model using one or more rooted sub-trees for each node or stage of the tree structure of previously executed communication workflows; and generate a multi-dimensional vector representation as an output of the trained machine-learning model to represent the tasks, contents of the tasks and structure of the communication workflow, the multi-dimensional vector representation having been learned using the one or more rooted sub-trees of each node or stage of the tree structure, wherein the multi-dimensional vector representation is used to generate task recommendations and predictions of performance values that indicate a likelihood of receiving an interaction in response to performing a function of one or more corresponding tasks that comprise a non-terminating task of the communication workflow.

10. The system of claim 9, wherein the operations further comprise:
   accessing a set of previously-executed communication workflows;
   defining a tree structure for each previously-executed communication workflow of the set of previously-executed communication workflows;
   inputting the tree structure of each previously-executed communication workflow of the set of previously-executed communication workflows into the machine-learning model;
   generating a vector representation representing the tree structure of each previously-executed communication workflow of the set of previously-executed communication workflows; and
   storing the vector representation of each previously-executed communication workflow in a training data set.

11. The system of claim 9, wherein the multi-dimensional vector representation of the tree structure is generated without evaluating a vector representation of an individual node of the plurality of nodes or of an individual stage of the one or more stages of the tree structure.

12. The system of claim 9, wherein each node of the plurality of nodes and each stage of the one or more stages of the tree structure is associated with metadata used to characterize the task or a portion of the communication workflow.

13. The system of claim 12, wherein the metadata associated with each node or stage represents a function performed by the task associated with the node or stage, respectively.

14. The system of claim 9, wherein the operations further comprise:
   extracting one or more rooted partial tree structures for each node of the plurality of nodes or each stage of the one or more stages of the tree structure of the communication workflow, each rooted partial tree structure of the one or more rooted partial tree structure including a set of nodes one or more hops away from the node or stage; and
   training the machine-learning model using the one or more rooted partial tree structures.

15. A computer-program product tangibly embodied in a non-transitory machine-readable storage medium, including instructions configured to cause a processing apparatus to perform operations including:
   accessing a communication workflow including one or more ordered sequence of tasks, the communication workflow being configured to facilitate interactions with a set of user devices over a communication channel that is selected based on the communication workflow, each task of the one or more ordered sequence of tasks including executable code that, upon execution, performs a function associated with the set of user devices, and the communication workflow being associated with one or more parameters that characterize each task of the one or more ordered sequence of tasks of the communication workflow;
   identifying a structure of the communication workflow as a tree structure, wherei the tree structure includes a plurality of nodes and one or more stages, wherein two nodes of the plurality of nodes of the tree structure are connected by at least one stage of the one or more stages, and wherein each task of the one or more ordered sequence of tasks of the communication workflow corresponds to a node of the plurality of nodes or a stage of the one or more stages;
   training a machine-learning model using one or more rooted sub-trees for each node or stage of the tree structure of previously executed communication workflows; and
   generating a multi-dimensional vector representation as an output of the trained machine-learning model to represent the tasks, contents of the tasks and structure of the communication workflow, the multi-dimensional vector representation having been learned using the one or more rooted sub-trees of each node or stage of the tree structure, wherein the multi-dimensional vector representation is used to generate task recommendations and predictions of performance values that indicate a likelihood of receiving an interaction in response to performing a function of one or more corresponding tasks that comprise a non-terminating task of the communication workflow.

16. The non-transitory machine-readable storage medium of claim 15, wherein the operations further comprise:
   accessing a set of previously-executed communication workflows;
   defining a tree structure for each previously-executed communication workflow of the set of previously-executed communication workflows;
   inputting the tree structure of each previously-executed communication workflow of the set of previously-executed communication workflows into the machine-learning model;
   generating a vector representation representing the tree structure of each previously-executed communication workflow of the set of previously-executed communication workflows; and
   storing the vector representation of each previously-executed communication workflow in a training data set.

17. The non-transitory machine-readable storage medium of claim 15, wherein the multi-dimensional vector representation of the tree structure is generated without evaluating a vector representation of an individual node of the plurality of nodes or of an individual stage of the one or more stages of the tree structure.

18. The non-transitory machine-readable storage medium of claim 15, wherein each node of the plurality of nodes and each stage of the one or more stages of the tree structure is associated with metadata used to characterize the task or a portion of the communication workflow.

19. The non-transitory machine-readable storage medium of claim 18, wherein the metadata associated with each node or stage represents a function performed by the task associated with the node or stage, respectively.

20. The non-transitory machine-readable storage medium of claim 15, wherein the machine-learning model is a neural network configured to learn embeddings of the tree structure of the communication workflow.

\* \* \* \* \*

UNITED STATES PATENT AND TRADEMARK OFFICE
CERTIFICATE OF CORRECTION

| | | |
|---|---|---|
| PATENT NO. | : 12,050,936 B2 | Page 1 of 1 |
| APPLICATION NO. | : 16/800911 | |
| DATED | : July 30, 2024 | |
| INVENTOR(S) | : Kalluri et al. | |

It is certified that error appears in the above-identified patent and that said Letters Patent is hereby corrected as shown below:

In the Claims

In Column 34, Line 16, in Claim 2, delete "in a" and insert -- in the --, therefor.

In Column 36, Line 23, in Claim 15, delete "wherei" and insert -- wherein --, therefor.

Signed and Sealed this
Tenth Day of December, 2024

Katherine Kelly Vidal
*Director of the United States Patent and Trademark Office*